United States Patent [19]
Yokota et al.

[11] Patent Number: 5,376,815
[45] Date of Patent: Dec. 27, 1994

[54] SEMICONDUCTOR DEVICE HAVING BIPOLAR-MOS COMPOSITE ELEMENT PELLET SUITABLE FOR PRESSURE CONTACTED STRUCTURE

[75] Inventors: Yoshio Yokota; Mitsuhiko Kitagawa, both of Tokyo; Dai Karasawa, Yokohama, all of Japan

[73] Assignee: Kabushiki Kaisha Toshiba, Kawasaki, Japan

[21] Appl. No.: 123,988

[22] Filed: Sep. 21, 1993

Related U.S. Application Data

[63] Continuation of Ser. No. 863,474, Apr. 2, 1992, abandoned, which is a continuation of Ser. No. 612,972, Nov. 15, 1990, abandoned.

[30] Foreign Application Priority Data

Nov. 17, 1989 [JP] Japan .................................. 1-298945
Sep. 14, 1990 [JP] Japan .................................. 2-245480

[51] Int. Cl.$^5$ ................... H01L 29/10; H01L 29/78; H01L 23/48; H01L 29/46
[52] U.S. Cl. ..................... 257/341; 257/327; 257/328; 257/329; 257/773; 257/775
[58] Field of Search .................. 357/52, 71, 79; 257/327, 336–337, 688–689, 727, 750, 773, 775, 776, 327–334, 341, 342, 343

[56] References Cited

U.S. PATENT DOCUMENTS

| 4,775,916 | 10/1988 | Kouzuchi et al. | 357/79 |
| 4,987,099 | 1/1991 | Flanner | 437/192 |
| 5,003,371 | 3/1991 | Tailliet et al. | 357/51 |

FOREIGN PATENT DOCUMENTS

| 0118007 | 9/1984 | European Pat. Off. | |
| 0159663 | 10/1985 | European Pat. Off. | 257/330 |
| 59-201431 | 11/1984 | Japan | 357/79 |
| 2166290 | 4/1986 | United Kingdom | |

OTHER PUBLICATIONS

K. P. Lisiak et al., "Optimization of Nonplanar Power MOS Transistors", *IEEE Transaction on Electron Devices*, vol. ED-25 (Oct. 1978) p. 1229–1234.

Tsunoda, T., "High-Power, High Speed Toshiba IGBT Module," Toshiba Discrete Semiconductor Engineering Dept., 1987.

*Primary Examiner*—J. Carroll
*Attorney, Agent, or Firm*—Finnegan, Henderson, Farabow, Garrett & Dunner

[57] ABSTRACT

A semiconductor device having a bipolar MOS composite element pellet suitable for a compression structure. In this pellet, a semiconductor substrate on which a MOS composite element is formed is electrically connected to an external part by an electrode plate compressed to the substrate.

6 Claims, 19 Drawing Sheets

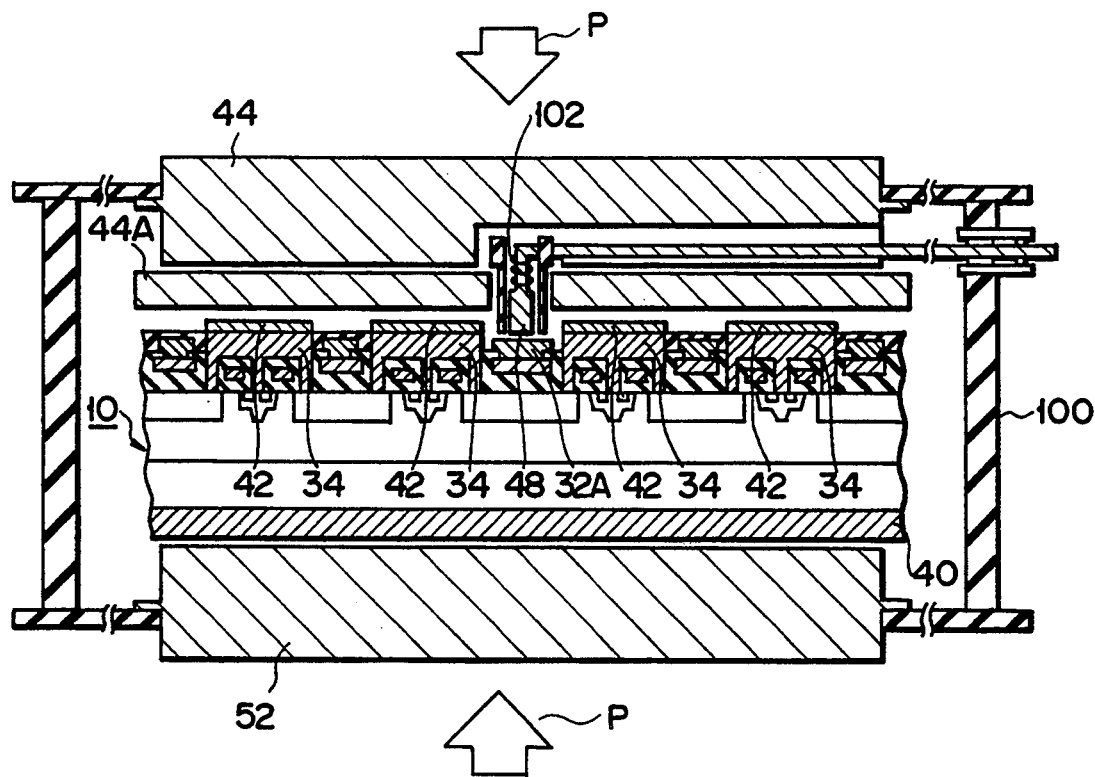
F I G. 5
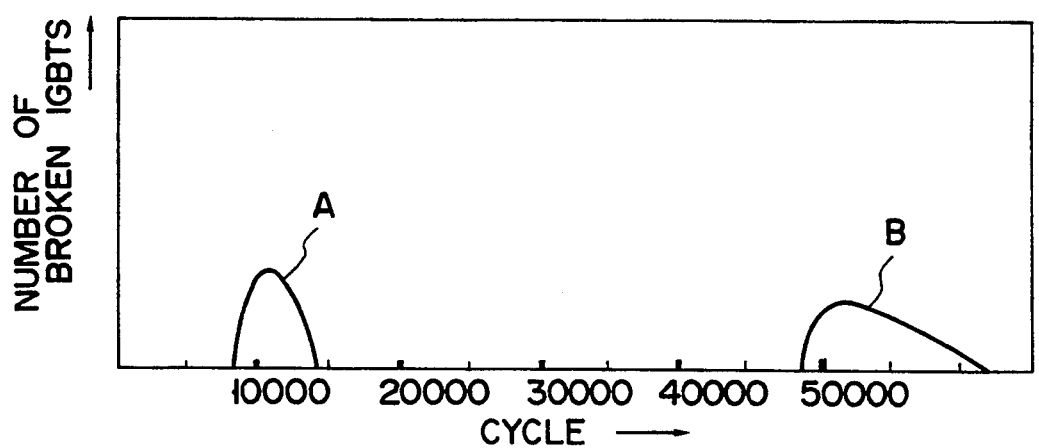
F I G. 6

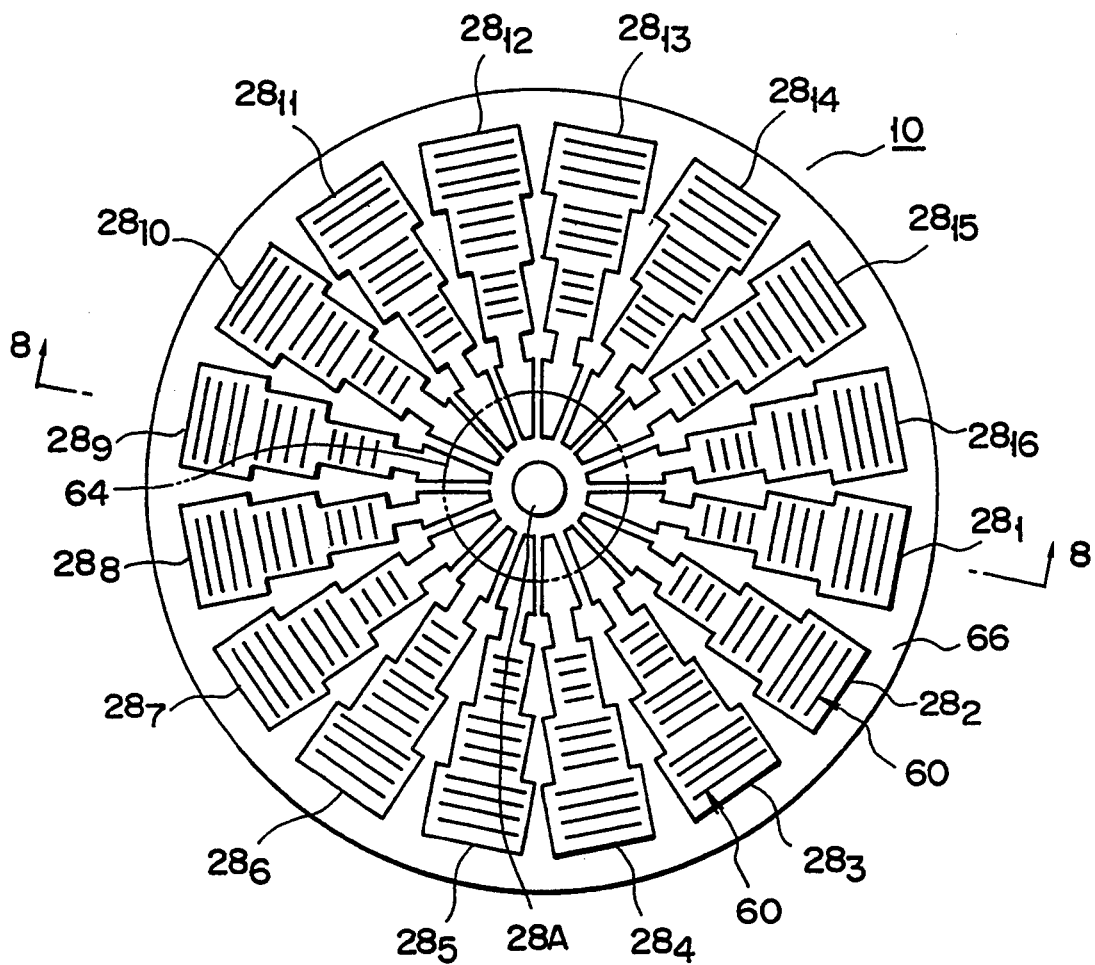
F I G. 7
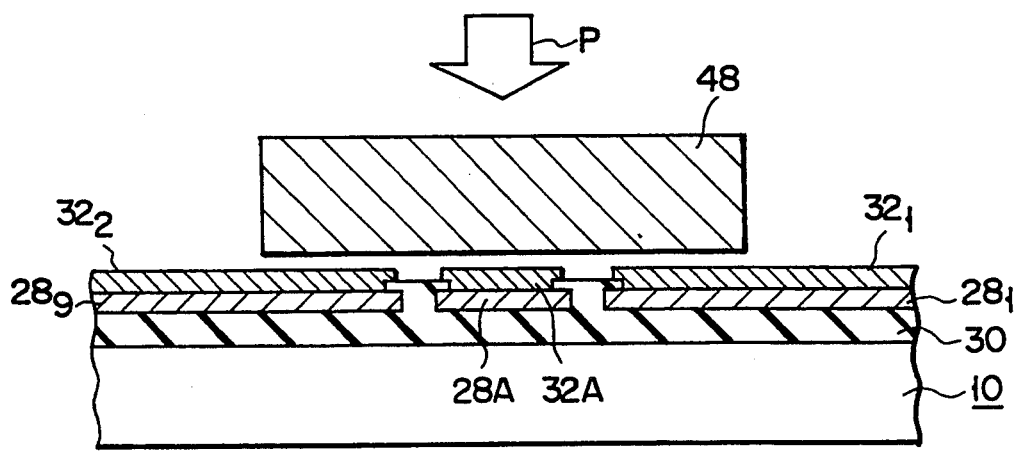
F I G. 8

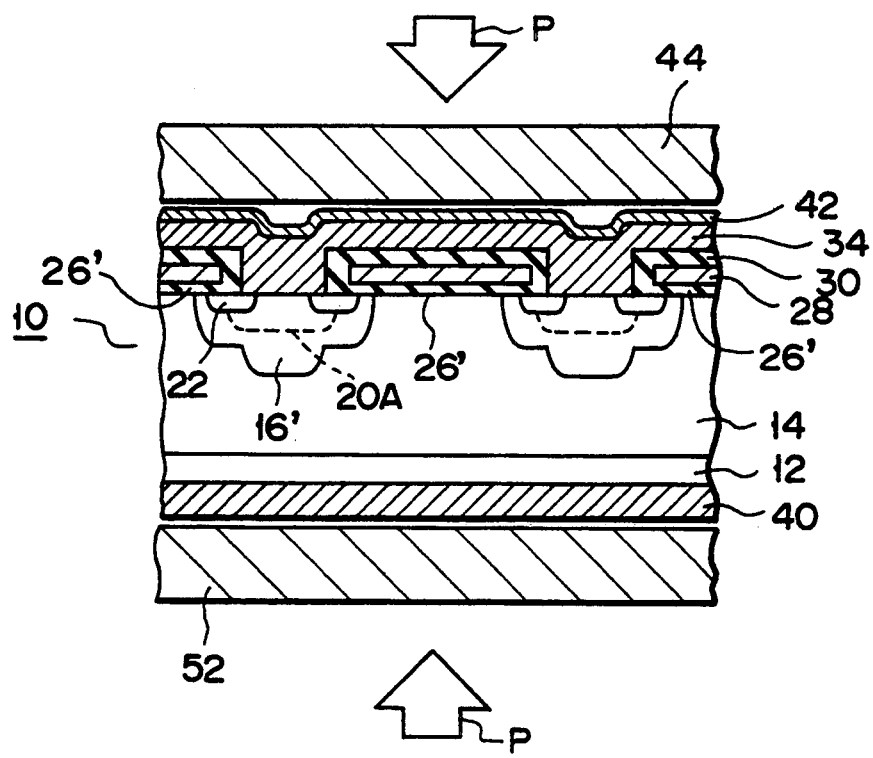
F I G. 14
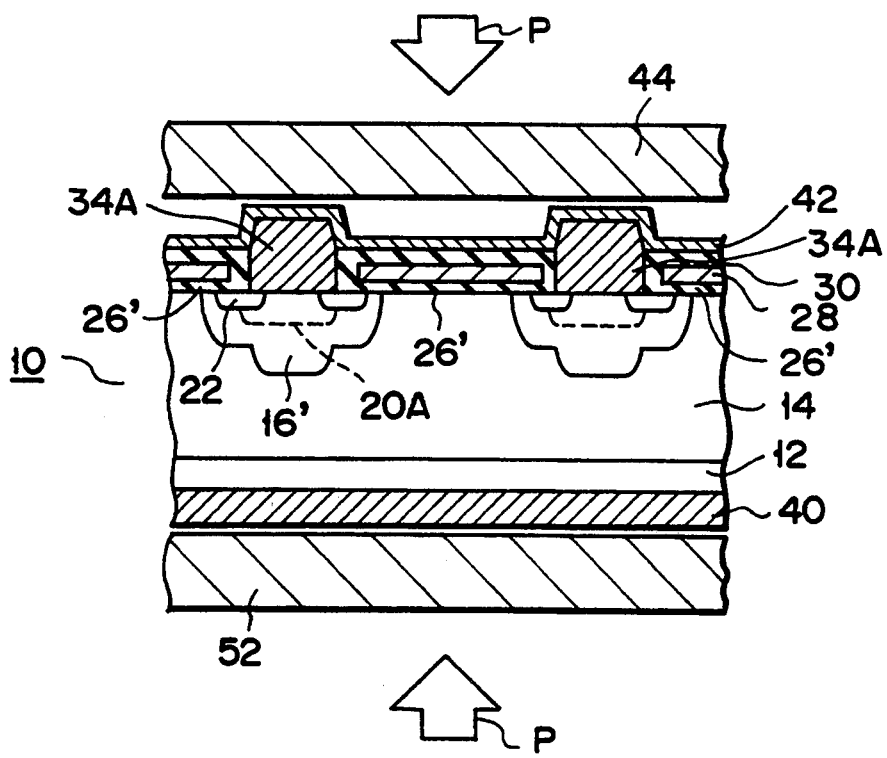
F I G. 15

SEMICONDUCTOR DEVICE HAVING BIPOLAR-MOS COMPOSITE ELEMENT PELLET SUITABLE FOR PRESSURE CONTACTED STRUCTURE

This application is a continuation, of application Ser. No. 07/863,474 filed Apr. 2, 1992, now abandoned, which is a continuation of prior application Ser. No. 07/612,972 filed Nov. 15, 1990, abandoned.

BACKGROUND OF THE INVENTION

1. Field of the Invention

The present invention relates to a high-power semiconductor device having a bipolar-MOS composite element and, more particularly, to a semiconductor device having a bipolar-MOS composite element pellet suitable for a pressure contacted structure.

2. Description of the Related Art

Conventional high-power semiconductor devices are available as devices for performing switching of large currents of several tens of amperes. Of these devices, a device incorporating a bipolar-MOS composite element pellet such as an IGBT (Insulated Gate Bipolar Transistor) is available as a high-power semiconductor device capable of a high-speed operation.

A conventional device of this type is described in detail in *High-Power, High-Speed Toshiba IGBT Module*, TOSHIBA CORPORATION, September 1987, p4.

As especially indicated by the diagram in the second step in the Assembly flow of FIG. 4 on page 4 in *High-Power, High-Speed Toshiba IGBT Module*, in the conventional device incorporating a bipolar-MOS composite element pellet, the pellet is electrically connected to external electrodes by wire bonding. Although such a conventional device is designed to conduct large currents, since the bonding wires serve as main current paths, the allowable current is small. If an overcurrent exceeding the allowable current flows in the device for some reason, bonding wires may be fused or may become disconnected from electrodes on the pellet or from external electrodes. Fusing and disconnection of bonding wires are especially dangerous for devices using large currents. Currently, for example, a fuse is arranged independently of a device so that if fusing/disconnection of bonding wires is caused, the fuse is fused to quickly stop the device to prevent explosion of the device.

In addition, such a device tends to generate heat due to switching of large currents. For this reason, degradation or breakage of bonding wires tends to occur especially due to thermal fatigue. This shortens the service life of each bonding wire and hence the service life of the device.

Furthermore, since bonding wires are bonded to electrodes consisting of aluminum, process fluctuation leads to fluctuation in bonding strength. This means that if bonding strength is decreased, disconnection of bonding wires from electrodes tends to occur.

SUMMARY OF THE INVENTION

It is an object of the present invention to provide a high-power semiconductor device incorporating a bipolar-MOS composite element pellet, which can safely conduct large currents and which has a long service life.

In order to achieve the above object, according to the present invention, there is provided a semiconductor device comprising: a semiconductor substrate having a major surface; a first electrode formed on the major surface to be insulated from the substrate; a second electrode formed in contact with the major surface; a first electrode plate compressed and connected to the first electrode; and a second electrode plate compressed and connected to the second electrode.

In the above-described semiconductor device, the pellet having the electrode formed thereon to be insulated from the substrate, i.e., insulating gates of a MOS type or the like, is compressed to be activated. With this arrangement, since no bonding wires are required, the safety of the device can be improved, and the service life of the device can be prolonged.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a sectional view showing a compression type package for housing the pellet shown in FIG. 4;

FIG. 6 is a graph showing thermal fatigue test TFT results;

FIG. 7 is a plan view showing a pellet used for an IGBT device according to the second embodiment of the present invention;

FIG. 8 is an enlarged view showing a part of a cross-section taken along a line 8—8 in FIG. 7;

FIG. 14 is a schematic sectional view showing a portion around the pellet of the IGBT device according to the first and second embodiments;

FIG. 15 is a schematic sectional view showing a portion around a pellet of an IGBT device according to the third embodiment of the present invention;

DETAILED DESCRIPTION OF THE PREFERRED EMBODIMENTS

Embodiments of the present invention will be described below with reference to the accompanying drawings.

Figure 1:
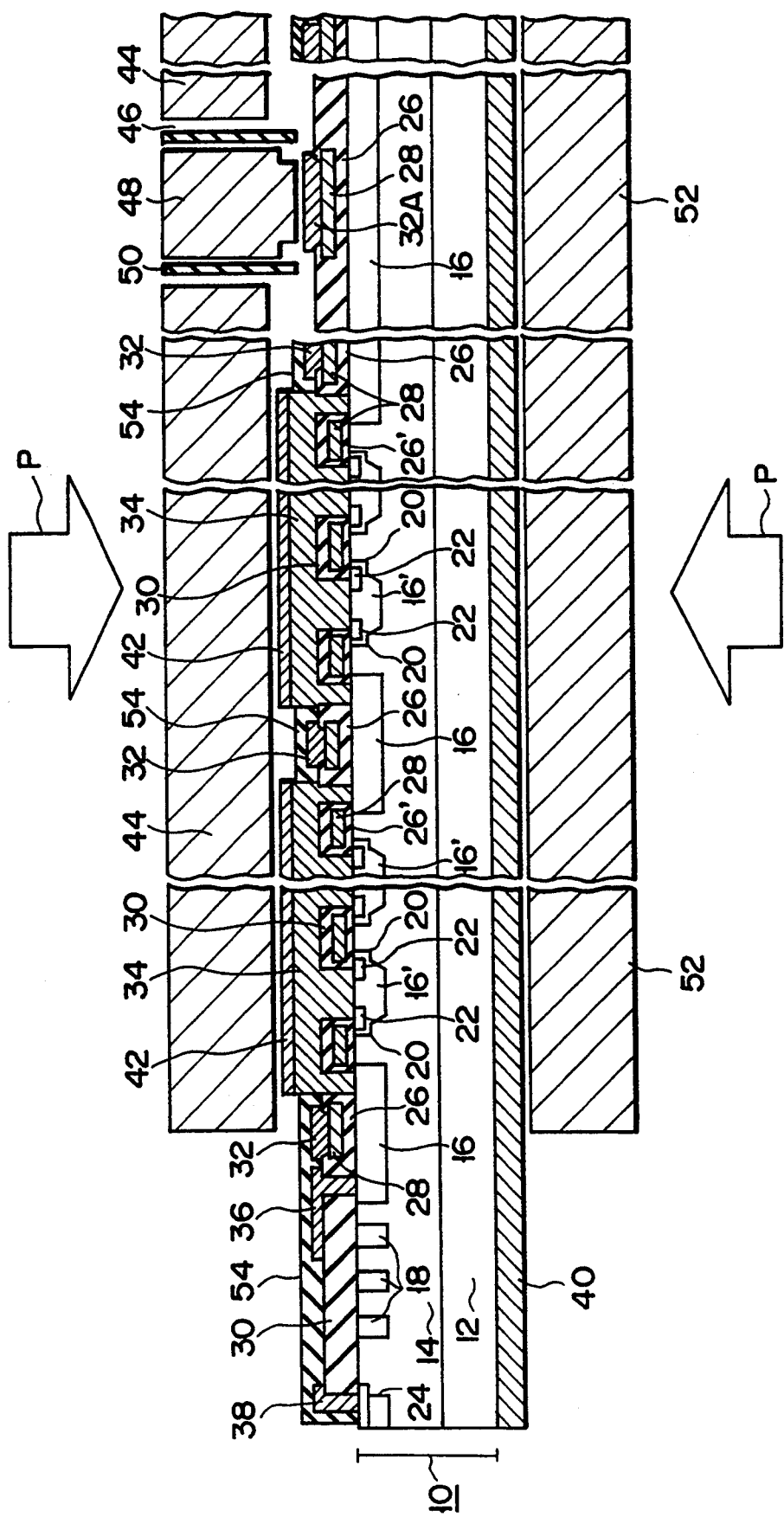
FIG. 1 is a sectional view showing a schematic arrangement of an IGBT device according to the first embodiment of the present invention.

FIG. 1 is a schematic sectional view showing an IGBT device according to the first embodiment of the present invention.

As shown in FIG. 1, an IGBT as an active element is formed on a semiconductor substrate 10. The IGBT has a structure in which a p-type anode region 12 is formed in the lower surface of the substrate 10, and an n-type collector region 14 is formed on the anode region 12. In the collector region 14, p+-type body regions 16 and 16' and p+-type guard rings 18 are formed to reach the upper surface of the substrate 10. A p-type base region 20 serving as a base is formed in the body region 16'. An n+-type source region 22 is formed in the base region 20. In addition, an n+-type channel stopper 24 is formed on a peripheral portion of the substrate 10. A gate electrode 28 consisting of, e.g., polysilicon is formed above the upper surface of the substrate 10 to extend over from the source region 22 to the collector region 14. This gate electrode 28 is insulated from the substrate 10 through an insulating film 26 on a gate insulating film 26'. The insulating film 26 has a thickness larger than that of the gate insulating film 26' to be free from the effect of an electric field from the gate electrode 28. The thickness of the gate insulating film 26' is set to be smaller than that of the insulating film 26 so as to form a channel in a surface region of the base region 20 by the effect of an electric field from the gate electrode 28. A surface of the gate electrode 28 is covered with an insulating interlayer 30 to be electrically insulated from other conductive layers. The insulating interlayer 30 has an opening corresponding to the gate electrode 28 on the insulating film 26. A gate wire 32 consisting of, e.g., aluminum, is electrically connected to the gate electrode 28 through this opening. The insulating interlayer 30 also has an opening for communicating with the body regions 16 and 16' and the source region 22. A source electrode 34 consisting of, e.g., aluminum, is electrically connected to regions 16, 16', and 22 through this opening. In addition, several electrodes are formed on an end portion of the active region of the substrate 10 to maintain or increase the reliability of the device. A field plate electrode 36 consisting of, e.g., aluminum, is electrically connected to the body region 16. An equivalent potential electrode 38 consisting of, e.g., aluminum, is electrically connected to the channel stopper 24 formed in a peripheral portion of the substrate 10. An anode electrode 40 consisting of, e.g., aluminum, is formed on the lower surface of the substrate 10 so as to be electrically connected to the anode region 12. Furthermore, in this embodiment, a conductive layer 42 is stacked on the source electrode 34. The conductive layer 42 is integrated with the source electrode 34 and hence also constitutes a source electrode. The conductive layer 42 is made of aluminum. This aluminum is the same material as that for, e.g., the gate wiring 32, the field plate electrode 36, and the equivalent potential electrode 38. A source compression electrode plate 44 is pressed against the conductive layer 42 with a pressure P so as to be electrically connected thereto. An opening 46 is formed in the source compression electrode plate 44. A gate compression electrode plate 48 is pressed against a gate extracting portion 32A to be connected thereto in substantially the center of the pellet through the opening 46. Reference numeral 50 denotes an insulating member for preventing a short circuit between the gate compression electrode plate 48 and the source compression electrode plate 44. The insulating member 50 is normally made of a polyfluoroethylene resin. In addition, an anode compression electrode plate 52 is pressed against the anode electrode 40 to be electrically connected thereto. A device of this type will be referred to as a compression type device hereinafter.

In the compression type device having the above-described arrangement, the conductive layer 42 is additionally stacked on the source electrode 34. With this, the level of the source electrode 34 from the major surface of the substrate 10 is set to be different from that of the gate wiring 32, of the field plate electrode 36, and the equivalent potential electrode 38. By setting the level of the source electrode 34 to be different from that of the gate wiring 32 and the like, the source compression electrode plate 44 can be pressed against the source electrode 34 without being brought into contact with the gate wiring 32 arranged on the upper surface of the substrate 10.

In addition, by setting differences between the levels of the electrodes formed above the major surface of the substrate 10, a pellet suitable for a compression type device can be obtained while the major surface of the substrate 10 is kept flat. For example, a "mesa type" pellet is available as a conventional pellet suitable for a compression type device, in which differences between the levels of electrodes are set by forming grooves in the major surface of a substrate. Since a mesa type pellet is formed by damaging the major surface of a substrate, i.e., by forming grooves, a decrease in withstand voltage or local concentration of currents is caused by variations in groove depth. Therefore, problems are posed in terms of reliability of an element, uniformity of characteristics, and the like. In contrast to this, in this embodiment, since the levels of the electrodes themselves formed above the major surface of the substrate 10 are set to be different from each other, a pellet suitable for a compression type device can be obtained, which can be formed without damaging the major surface of the substrate, has high reliability, and allows uniform characteristics.

The upper surfaces of the gate wiring 32, of the field plate electrode 36, and of the equivalent potential electrode 38 arranged on the upper surface of the pellet 10 are covered with an insulating member 54. Since the gate wiring 32 and the like are covered with the insulating member 54 in this manner, even if, for example, the conductive layer 42 is squashed to protrude toward the gate wire 32 upon application of the pressure P onto the respective compression electrode plates 44, 48, and 52, a short circuit between the conductive layer 42 and the gate wire 32 can be prevented. Note that a portion of the insulating member 54 is removed from the gate extracting portion 32A to allow electrical conduction between the portion 32A to the gate compression electrode plate 48.

In this embodiment, the source electrode 34 is divided into several portions, and the gate wiring 32 is arranged to cover the entire major surface of the substrate 10 to weave through the divided source electrodes 34. The gate wiring 32 is arranged to cover the major surface of the substrate 10 and is connected to the gate electrode 28. With this arrangement, the gate electrode 28 consisting of polysilicon and having a large resistance can be shunted by the gate wiring 32 consisting of aluminum and having a small resistance. For this reason, the resistance of the gate electrode 28 formed on the substrate 10 is decreased, and gate signals can be quickly transferred throughout the pellet, thus increasing the operation speed of the device.

As described above, according to the above-described embodiment, since a pellet having an IGBT formed thereon is electrically connected to an external portion by pressing electrode plates against the pellet, the safety against large currents can be improved and the service life of the device can be prolonged.

A method of manufacturing the IGBT device will be described below with reference to FIGS. 2A to 2D and 3A to 3D. FIGS. 2A to 2D are plan views showing an IGBT in the order of manufacturing steps. FIGS. 3A to 3D are sectional views taken along lines 3A—3A to 3D—3D in FIGS. 2A to 2D, respectively. The same reference numerals in FIGS. 2A to 2D and 3A to 3D denote the same parts as in FIG. 1.

Figure 2A:
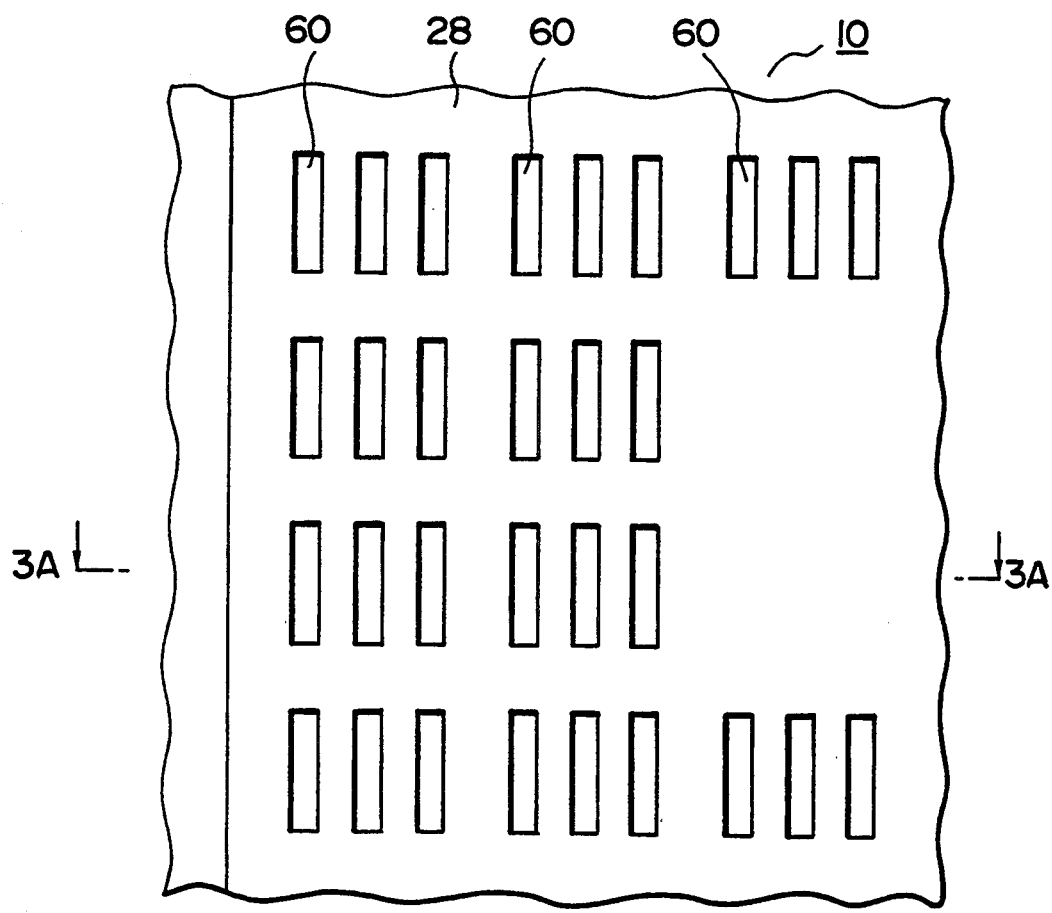
FIGS. 2A to 2D are plan views showing the IGBT device in the order of manufacturing steps.
Figure 3A:
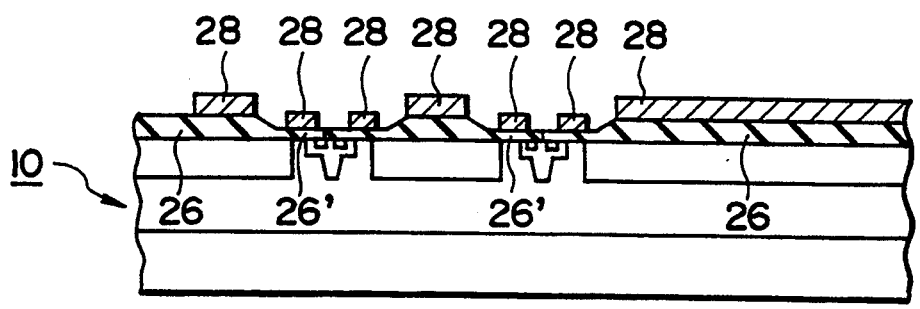
FIGS. 3A to 3D are sectional views taken along lines 3A—3A to 3D—3D in FIGS. 2A to 2D, respectively.

An n-type epitaxial layer (corresponding to the region 14) having a resistivity of 60 to 80 $\Omega$.cm and a thickness of about 90 to 100 $\mu$m, provided that a device having a withstand voltage of 1,000 V is to be formed, is formed on a p-type substrate (corresponding to the region 12) having a resistivity of 0.01 to 0.02 $\Omega$.cm and a thickness of about 450 $\mu$m. An oxide film having a thickness of about 1.5 $\mu$m (not shown) is formed on the resultant structure. The oxide film (not shown) is selectively removed by photoetching. Boron is then ion-implanted at an acceleration voltage of 35 keV and a dose of $2 \times 10^{15}$ cm$^{-2}$ by using the oxide film (not shown) as a mask, and thermal diffusion is performed at a temperature of 1,200° C., for about 12 hours, thus forming the p$^+$-type body regions 16 and 16'and the p$^+$-type guard rings 18. The oxide film 26 is formed on the resultant structure and is selectively removed by photoetching. The gate oxide film 26'having a thickness of 1,000 Å is formed on the region from which the oxide film 26 is removed. A polysilicon layer having a thickness of about 5,000 Å is formed on the resultant structure and is patterned into the gate electrode 28 by photoetching. Reference numeral 60 denotes a portion from which the polysilicon layer is removed. Subsequently, a resist pattern (not shown) is formed by photoetching. For example, boron is ion-implanted at an acceleration voltage of 60 keV and a dose of $1.1 \times 10^{14}$ cm$^{-2}$ by using this pattern as a mask. The resist is then peeled off, and thermal diffusion is performed at a temperature of 1,100° C. for about 10 hours to form the p-type base region 20. A resist pattern (not shown) is formed again by photoetching. For example, boron is ion-implanted at an acceleration voltage of 35 keV and a dose of $1 \times 10^{15}$ cm$^{-2}$. The resist is the peeled off, and thermal diffusion is performed at a temperature of 1,100° C. for about 90 minutes so that the impurity concentration of a portion of the p$^+$-type body region 16'with which an electrode is brought into contact is slightly increased (FIGS. 2A and 3A).

Figure 2B:
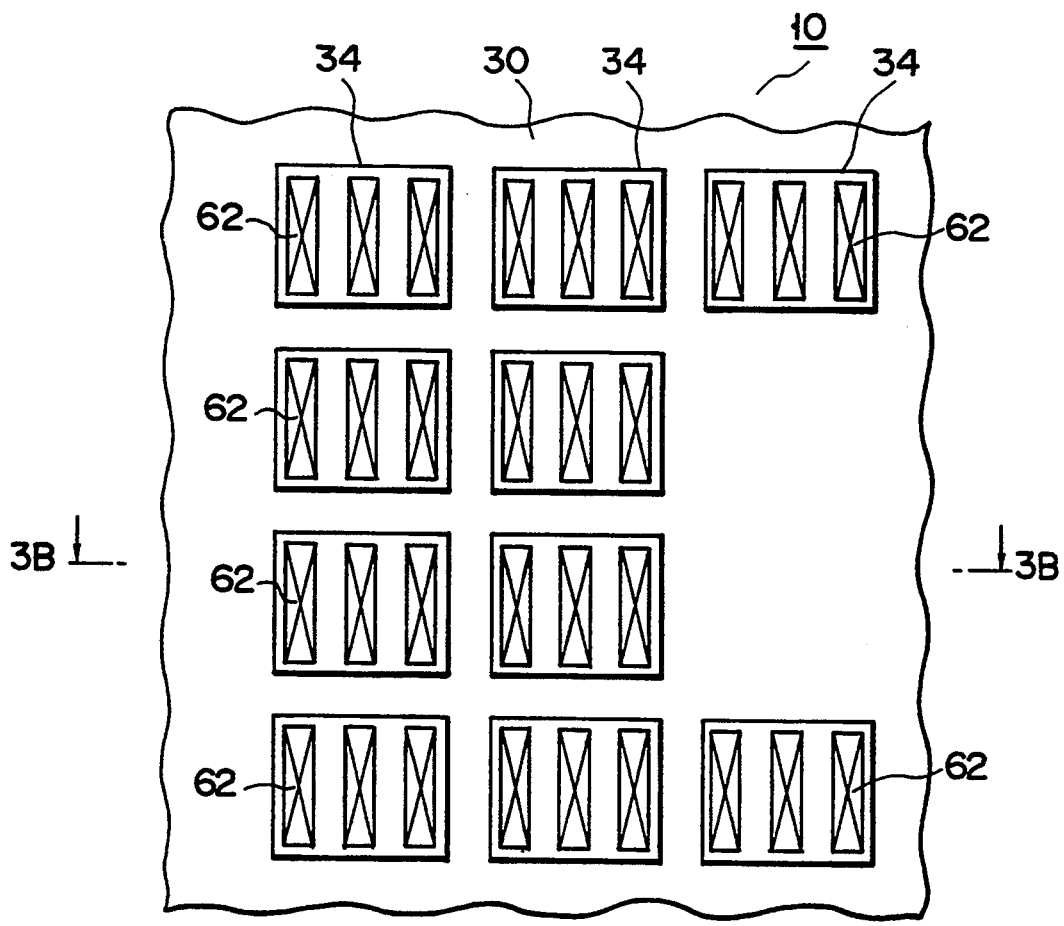
Figure 3B:
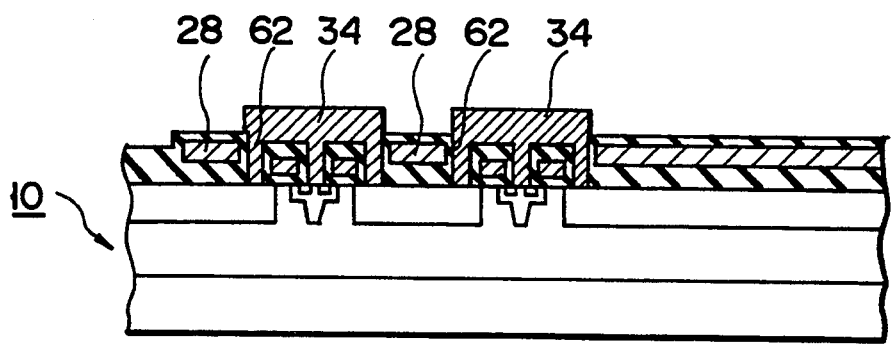

Subsequently, an oxide film is formed on the entire upper surface of the device, and the channel stopper 24 is formed on a peripheral portion of the pellet 10 by photoetching. A resist pattern (not shown) is formed on the resultant structure by photoetching. For example, phosphorus is ion-implanted at an acceleration voltage of 40 keV and a dose of $2 \times 20^{15}$ cm$^{-2}$. The resist is peeled off, and thermal diffusion is performed at a temperature of 1,000° C. for about 20 minutes to form the n$^+$-type source region 22. At this time, phosphorus is also doped into the channel stopper 24 and the gate electrode 28 consisting of polysilicon. The insulating interlayer 30 consisting of, e.g., an oxide film, a BPSG film, and a PSG film is formed on the entire upper surface of the device to have a thickness of about 1.5 $\mu$m by using, e.g., CVD. Thereafter, phosphorus gettering is performed by using phosphoryl chloride as an evaporation source. Source contact holes 62 are then formed by photoetching. A first aluminum layer is formed on the entire upper surface of the device by sputtering. The first aluminum layer is patterned into the source electrode 34 by photoetching (FIGS. 2B and 3B).

Figure 2C:
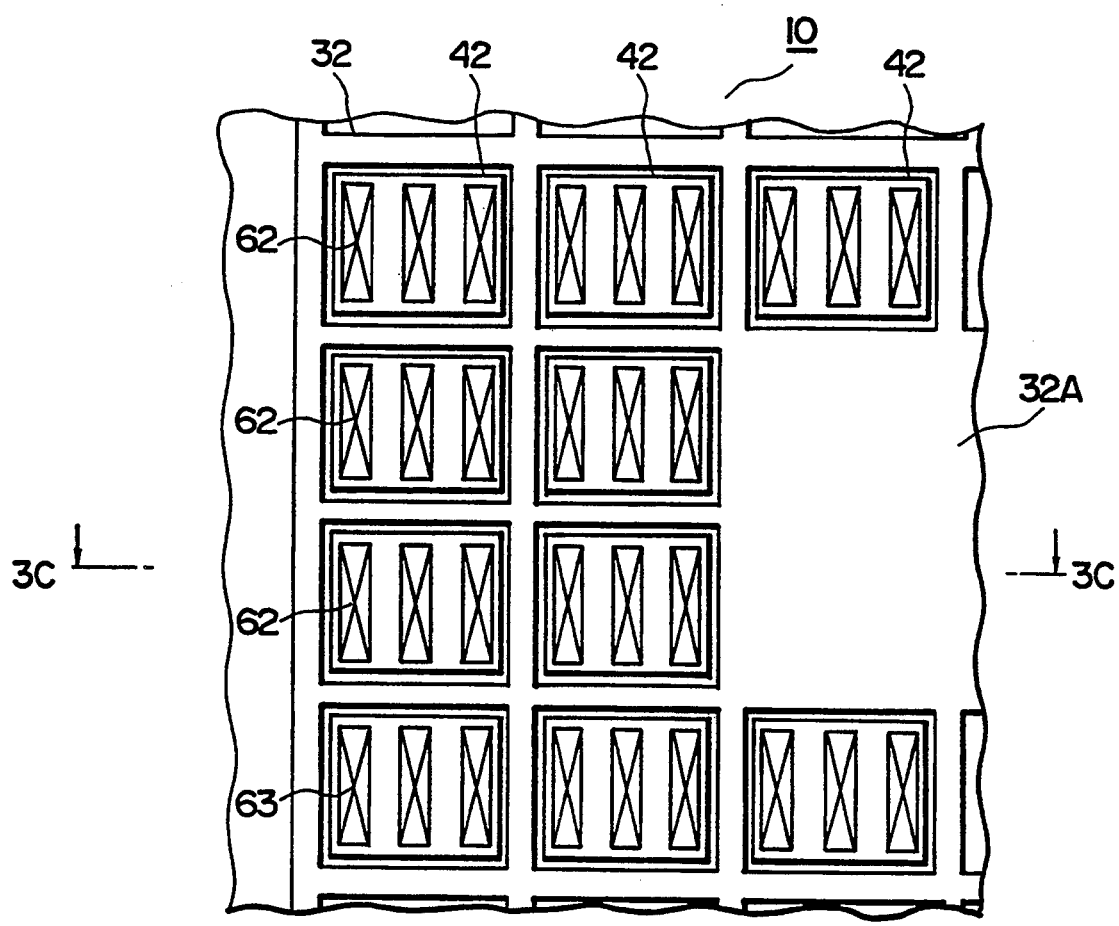
Figure 3C:
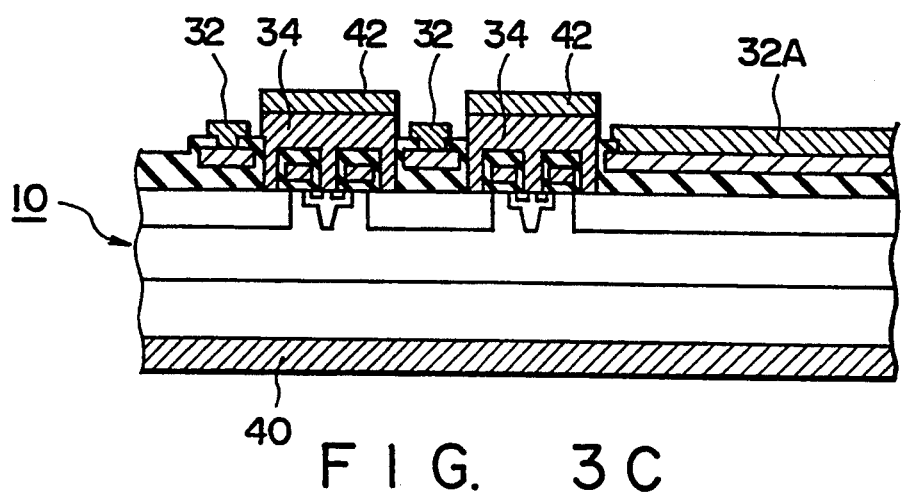

The source contact holes 62 communicating with the gate electrode 28 is formed in the insulating interlayer 30 by photoetching. A second aluminum layer is formed on the entire upper surface of the device by, e.g., sputtering. The second aluminum layer is then patterned into the gate wiring 32, the field plate electrode 36, and the equivalent potential electrode 38. At this time, a portion of the second aluminum layer is left on the source electrode 34, and the conductive layer 42 is formed (FIGS. 2C and 3C).

The insulating member 54 consisting of, e.g., polyimide is coated on the entire upper surface of the substrate 10. The coated insulating member 54 is baked. Portions of the insulating member 50 above the source electrode 34 and the gate extracting portion 32A are selectively removed by photoetching. The lower surface of the substrate is then subjected to lapping for a thickness of about 50 $\mu$m, and an aluminum layer having a thickness of about 10 $\mu$m is formed on the lower surface of the substrate, thus forming the anode electrode 40.

Figure 2D:
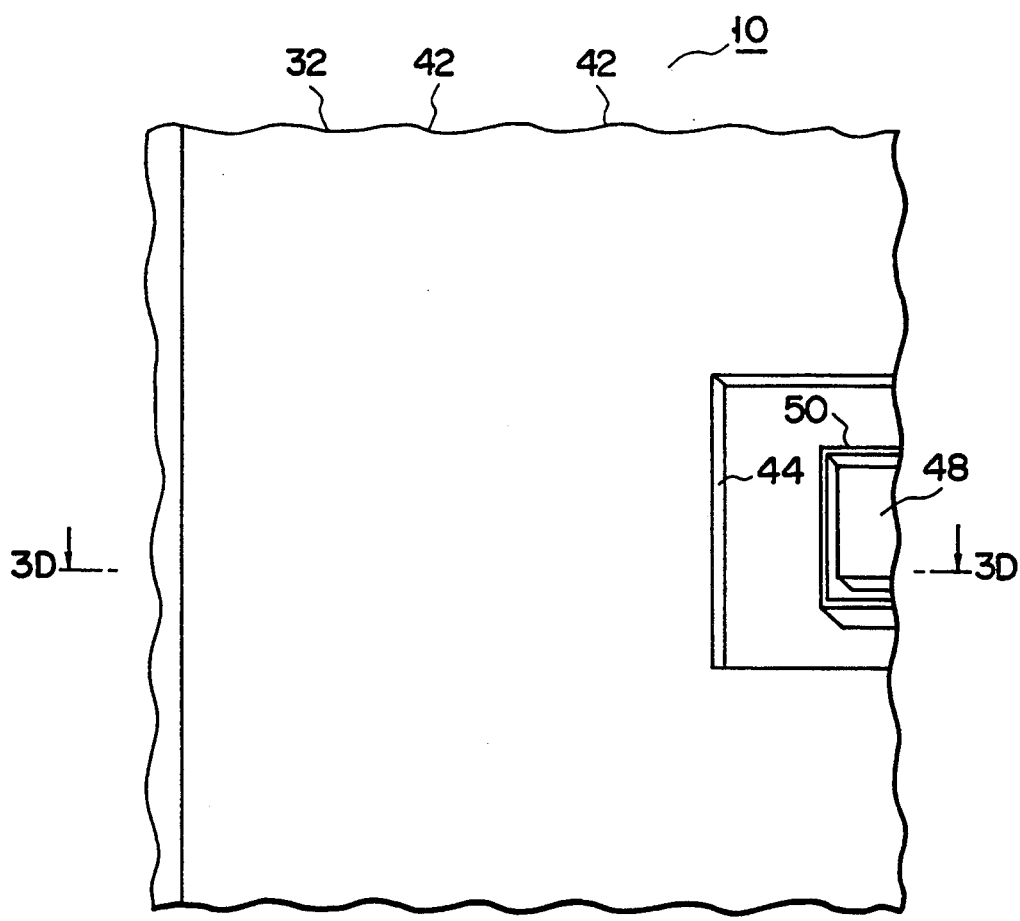
Figure 3D:
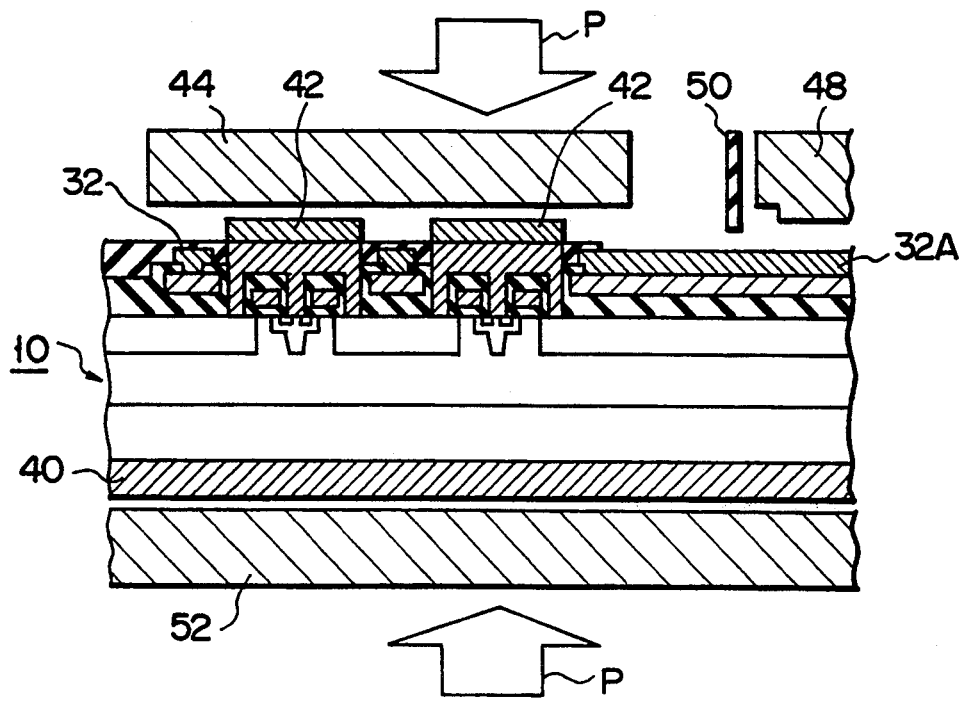

After the above-described process, for example, cutting of a wafer is performed. If, for example, a wafer having a diameter of 100 mm is to be used, four pellets each having a diameter of 33 mm (I$_F$ 300 A) can be arranged thereon. Hence, one wafer is cut into four pellets. Thereafter, each pellet obtained by cutting is housed in a compression type package (not shown), and the compression electrode plates 44, 48, and 52 are respectively pressed against the corresponding electrodes, thus completing the IGBT device according to the above-described embodiment (FIGS. 2D and 3D).

In the present invention, the shape of a pellet is not specifically limited. For example, a pellet may have a rectangular or circular shape. A large GTO and the like are available as conventional compression type devices. In a large GTO of this type, a pellet is circular, and a compression type package for housing a circular pellet is known. If, therefore, the pellet described with reference to the first embodiment is set to have a circular shape and is housed in this currently available GTO compression type package, no compression type package specially designed for the present invention need be manufactured.

Figure 4:
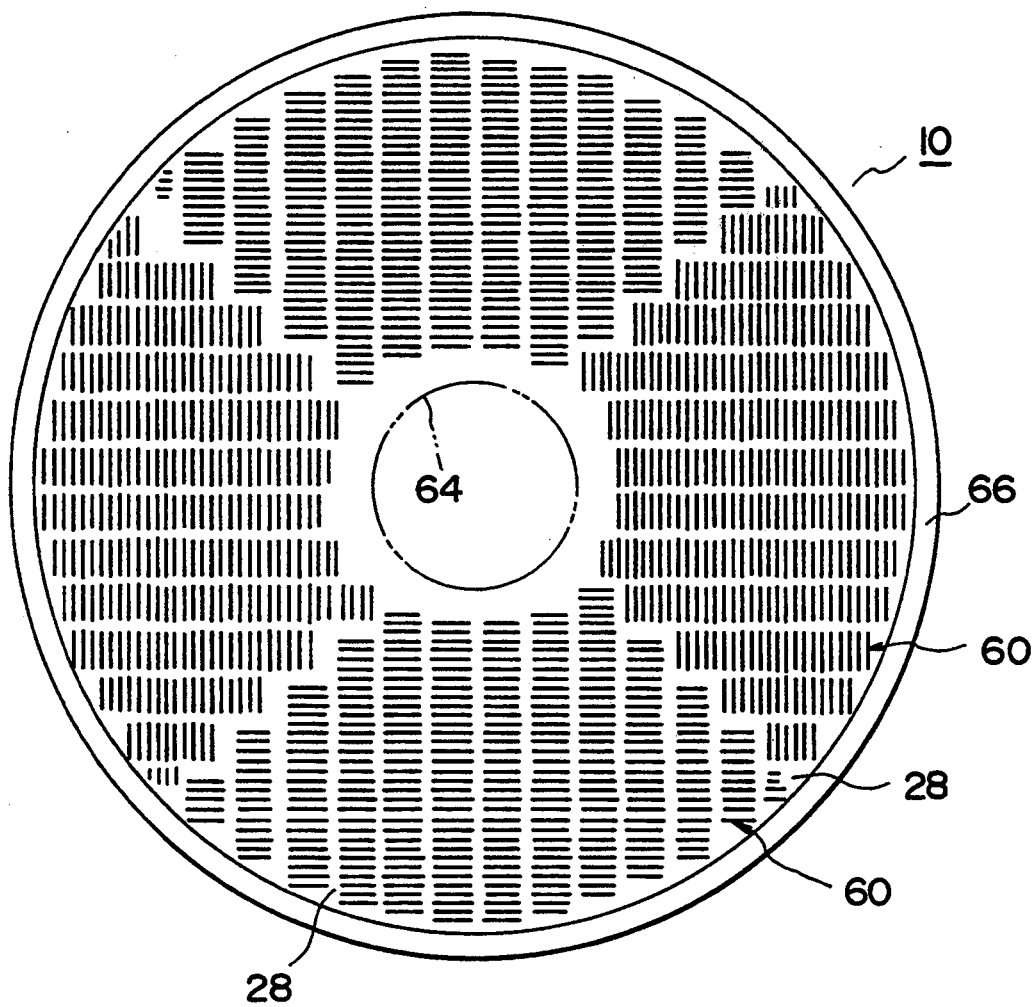
FIG. 4 is a plan view showing a case wherein the pellet of the first embodiment has a circular shape.

FIG. 4 is a schematic plan view of a pattern, showing a case wherein the pellet described with reference to the first embodiment has a circular shape. FIG. 5 is a sectional view showing a currently available GTO compression type package for housing the pellet shown in FIG. 4. Note that FIG. 4 shows a state of the pellet in which a gate electrode consisting of polysilicon is formed. The same reference numerals in FIGS. 4 and 5 denote the same parts as in FIG. 1.

As shown in FIG. 4, a gate electrode 28 consisting of polysilicon is formed on a substrate 10. Reference numeral 60 denote openings for source contact. Reference numeral 64 denotes a region against which a gate compression electrode plate is pressed; and 66, a pellet peripheral portion on which a guard ring and the like are formed.

A gate wire (not shown) corresponding to the pattern is formed on the gate electrode 28.

As shown in FIG. 5, the pellet 10 is housed in a compression type package constituted by, e.g., an insulating cylindrical member 100. A source compression electrode plate 44 and an anode compression electrode plate 52 are mounted on the cylindrical member 100 and are pressed against source electrodes 34 and 42 and an anode electrode 40 formed on the pellet 10 upon application of a pressure P. The source compression electrode plate 44 may be pressed against the source electrodes 34 and 42 through, a conductive plate 44A. An opening is provided in substantially the center of the plate 44A. A gate compression electrode plate 48 is pressed against a gate extracting portion 32A through this opening with a pressure from, a belleville spring 102.

As described above, if a circular pellet having an IGBT formed thereon is used, a currently available large GTO compression type package can be employed as a compression type package. No special compression type package need not be newly designed, and hence a low-cost device can be realized.

Results obtained by performing a TFT (Thermal Fatigue Test) of compression type IGBT devices according to the present invention and of conventional bonding type IGBT devices will be described below.

FIG. 6 shows the TFT results (the distributions of broken devices).

A sine half-wave current was supplied to a device. The device was cooled by air. Such steps from an increase in temperature to cooling of a device were considered as one cycle. The TFT was performed by checking a specific number of cycles at which a device was broken.

Referring to FIG. 6, reference symbol A denotes the distribution of broken bonding type IGBT devices and reference symbol B, represents the distribution of broken compression type IGBT devices. As is indicated by FIG. 6, a large number of bonding type IGBT devices were broken around 10,000 cycles, whereas most of compression type IGBT devices were not broken until 50,000 cycles. It was found from the results that the service life of the IGBT device according to the present invention was longer than that of the conventional device.

FIG. 7 is a plan view of a pattern showing a pellet used for an IGBT device according to the second embodiment of the present invention. FIG. 8 is an enlarged view showing a part of a cross-section taken along a line 8—8 in FIG. 7.

The same reference numerals in FIGS. 7 and 8 denote the same parts as in FIG. 4.

As shown in FIGS. 7 and 8, a gate electrode is divided into a plurality of islands $28_1$ to $28_{16}$. When the gate electrode is divided into the plurality of islands $28_1$ to $28_{16}$, the yield of pellets can be improved. Reference numeral 28A denotes a reinforcing member which is flattened when a gate compression electrode plate is compressed and which prevents excessive force acting on a gate extracting portion. The reinforcing member 28A consists of polysilicon as do the islands $28_1$ to $28_{16}$, although it does not especially serve as an electrode.

Gate wires (not shown) having shapes corresponding to the islands are formed on the islands $28_1$ to $28_{16}$. A reinforcing aluminum layer having a shape corresponding to the reinforcing member 28A is left on the reinforcing member 28A. For example, the gate electrode 28, shown in FIG. 4, consists of a single polysilicon plate. In this case, when a withstand voltage fault between the gate and the source occurs at even one portion in any place on the gate electrode, the pellet is a defective one. For this reason, the gate electrode is divided into a plurality of islands. When the gate electrode is divided into a plurality of islands, when a withstand voltage fault occurs in any island, other islands are not adversely affected. Therefore, the IGBT can be activated using only normal islands.

When a pellet having a diameter of 50 mm is used as an example, the area of a gate electrode corresponding to a source region is about 1,600 mm$^2$ in the pellet shown in FIG. 4. Pellets having withstand voltage faults, e.g., a leakage current between the gate and source which is conspicuously large, are produced at a remarkably high probability. However, in a pellet shown in FIG. 7, since the gate electrode pattern is divided into sixteen islands, the area corresponding to the source region is about 100 mm$^2$. When the source region has such an area, a portion having a withstand voltage fault is produced only at a low probability. In addition, even if an island having a withstand voltage fault is present as described above, the IGBT can be activated by normal islands without using the defective island. Therefore, the pellet is not defective, and the yield of pellets can be improved.

Figure 9:
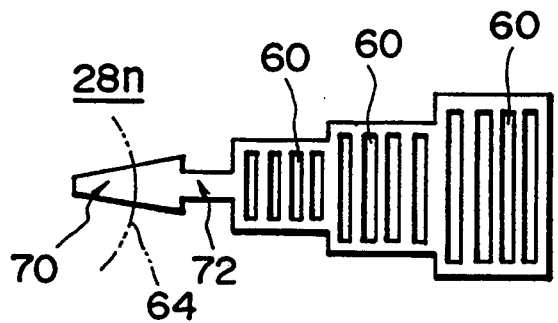
FIG. 9 a plan view showing one of the islands in FIG. 7.

FIG. 9 is a view showing one of the islands shown in FIG. 7.

As shown in FIG. 9, openings 60 communicating with source regions (not shown) formed in the substrate are formed in the island 28$n$. The island 28$n$ consists of a portion in which the openings 60 are formed, a portion 70 to which a gate compression electrode plate is compressed, and a gate connecting portion 72 for electrically connecting these portions.

A practical method of treating the pellet shown in FIG. 7 will be described below.

In this pellet, a gate-source leakage current of each divided island is measured in the inspection step after completion of the wafer step. This measurement is performed by a wafer prober or the like. That is, the probe is attached to the source electrode and the gate electrode is exposed on the surface of the pellet, and a predetermined inspection signal is supplied to the source and gate electrodes, thereby determining whether a gate-source leakage current is present or absent.

If it is determined that a gate-source leakage current is present in any one island, an excessive voltage is applied between the gate and the source of only this island to break the insulation between the gate and the source, and to short-circuit the gate and the source. In addition, a gate connecting portion, reference numeral 72 shown in FIG. 9, of the island is disconnected. In the above operation, the island having a withstand voltage fault is electrically isolated from the pellet. As a method of disconnecting the gate connecting portion, a gate wiring consisting of aluminum on a region corresponding to the connecting portion is etched or removed, and polysilicon constituting the exposed connecting portion is etched.

Figure 10:
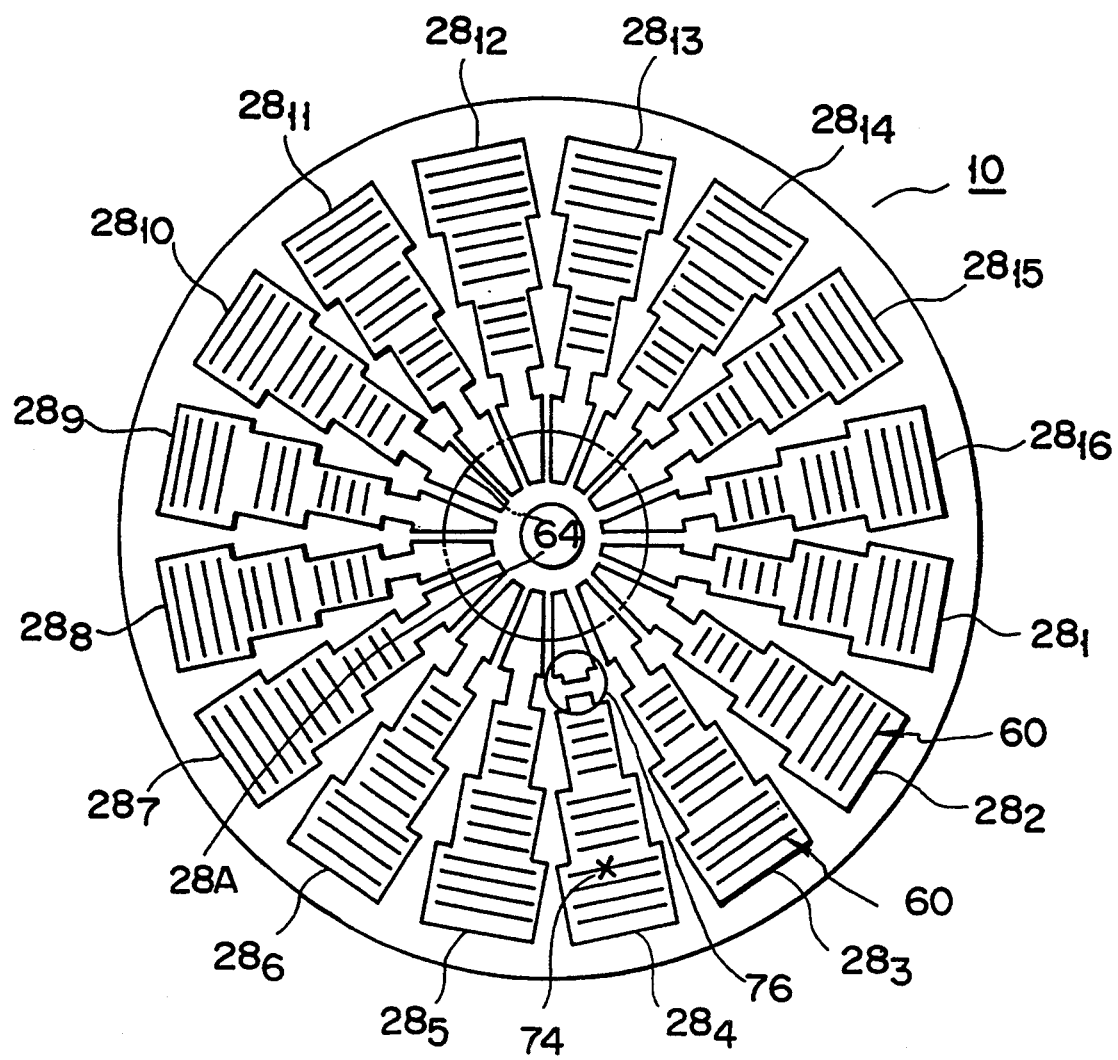
FIG. 10 is a plan view showing a state wherein an island having a withstand voltage fault is electrically separated from the pellet.

FIG. 10 is a plan view of a pattern showing a state wherein an island having a withstand voltage fault is electrically isolated from the pellet. The same reference numerals in FIG. 10 denote the same parts as in FIG. 7, and only different parts will be described below.

As shown in FIG. 10, it is assumed that a portion of the island $28_4$ represented by reference numeral 74 is determined to be defective and that the island $28_4$ has a withstand voltage fault. As represented by reference numeral 76, the connecting portion is disconnected, and the island $28_4$ is electrically isolated from the pellet. The pellet from which the defective island $28_4$ is electrically isolated is housed in a compression package.

Figure 11:
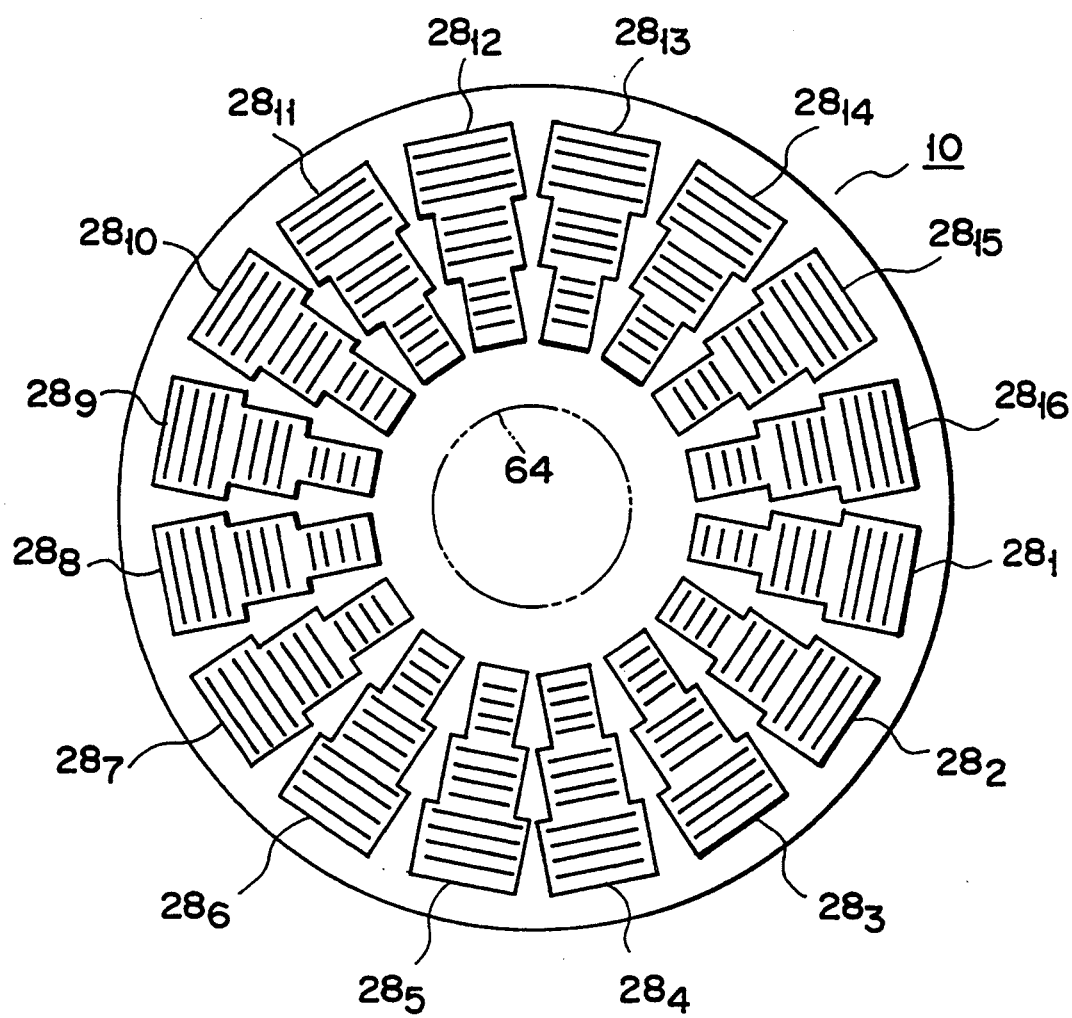
FIGS. 11 and 12 are plan views each showing a pellet used for an IGBT device according to a modification of the second embodiment.
Figure 12:
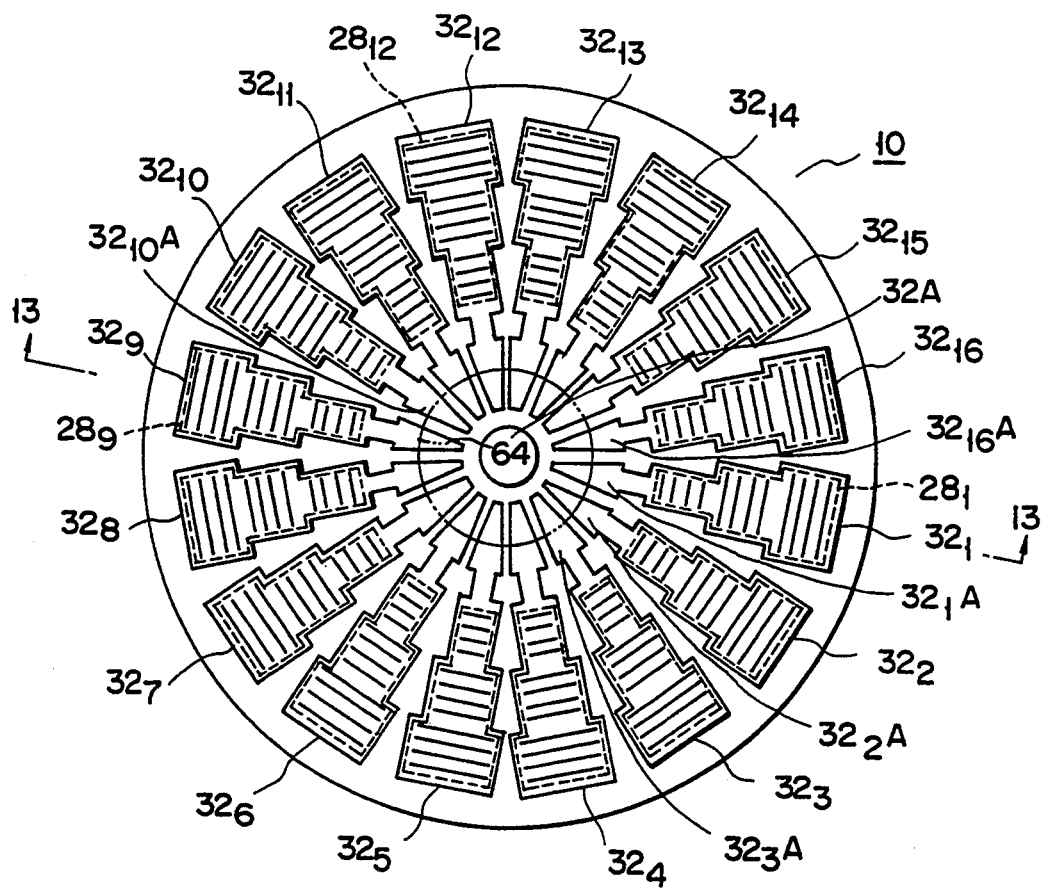
Figure 13:
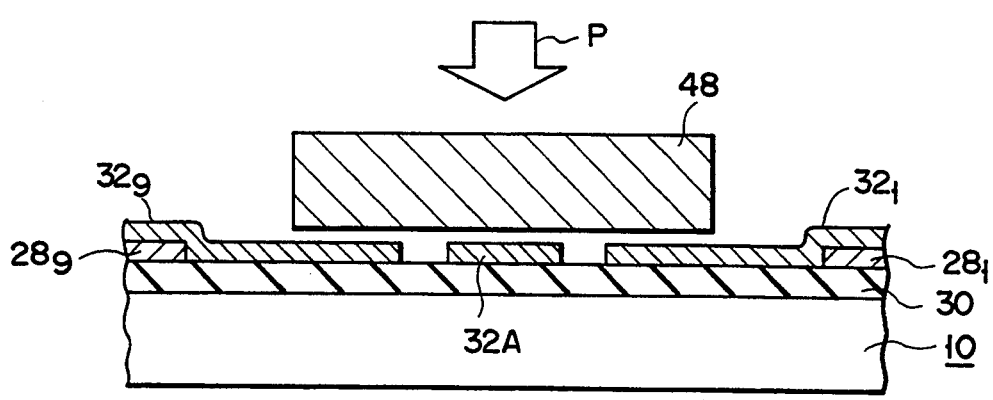
FIG. 13 is an enlarged view showing a part of a cross-section taken along a line 13—13 in FIG. 12.

FIGS. 11 and 12 are plan views of a pattern, each showing a pellet used for an IGBT device according to a modification of the second embodiment. FIG. 13 is an enlarged view showing a part of a cross-section taken along a line 13—13 in FIG. 12. The same reference numerals in FIGS. 11 to 13 denote the same parts as shown in FIG. 4, and only different parts will be described below.

AS shown in FIG. 11, in this modification, patterns of the islands $28_1$ to not $28_{16}$ are modified to extend to the compressed region 64. Application of a gate potential is performed as follows. As shown in FIG. 12, gate wirings $32_1$ to $32_{16}$ extend to the compressed region 64, and a gate compression electrode plate is compressed to the gate wirings 32, to $32_{16}$ to apply the gate potential to the islands $28_1$ to $28_{16}$. In order to isolate a defective island from the pellet, the gate wirings $32_1$ to $32_{16}$ between gate extracting portions $32_1A$ to $32_{16}A$ and the islands $28_1$ to $28_{16}$ are disconnected.

FIG. 14 is a schematic sectional view showing a portion around the pellet of an IGBT device according to the first and second embodiments. The same reference numerals in FIG. 14 denote the same parts as in FIG. 1.

As shown in FIG. 14, in the above embodiments, the source electrode 34 is formed by the first aluminum layer, and the conductive layer 42, formed by the second aluminum layer, is stacked on the source electrode 34. A gate wire (not shown) and the like are formed.

In the above method, the level of a portion of the source electrode 34 above the gate electrode 28 is higher than that of a portion contacting the source region 22. In this state, only a portion of the source electrode 34 projecting above the gate electrode 28 is compressed to the source compression electrode plate 44, thereby applying a strong pressure on the gate insulating film 26'. When pressure acts on the gate insulating film 26', the insulating film breaks and a change in interface charge concentration can easily occur. As the result, a yield of pellets is decreased, and reliability of the gate insulating film 26' is degraded.

FIG. 15 is a schematic sectional view showing a portion around a pellet of an IGBT device according to the third embodiment of the present invention. The reference numerals in FIG. 15 denote the same part as in FIG. 1, and only different parts will be described below.

As shown in FIG. 15, in the third embodiment, the level of the source electrode 34 above the gate electrode 28 is lower than other portions in consideration of the fact that a pressure directly acts on the gate insulating film 26' during compression. More specifically, a first aluminum layer 34A is partially left in the opening communicating with the source region 22. The level of the first aluminum layer 34A from the major surface of the substrate 10 is higher than that of, the insulating interlayer 30. The first aluminum layers 34A which are partially left are connected by the second aluminum layer 42 to each other to serve as source electrodes. Thus, the pressure generated upon compression does not directly act on the gate insulating film 26', and degradation in reliability of the gate insulating film 26' can be prevented. Characteristics of the element can be well maintained, and the gate insulating film 26' is not broken. An IGBT device according to the present invention can be produced at a high yield.

Reference numeral 20A denotes a high-concentration portion for contacting a source electrode to a base region, although this is not shown in FIG. 1.

Figure 16:
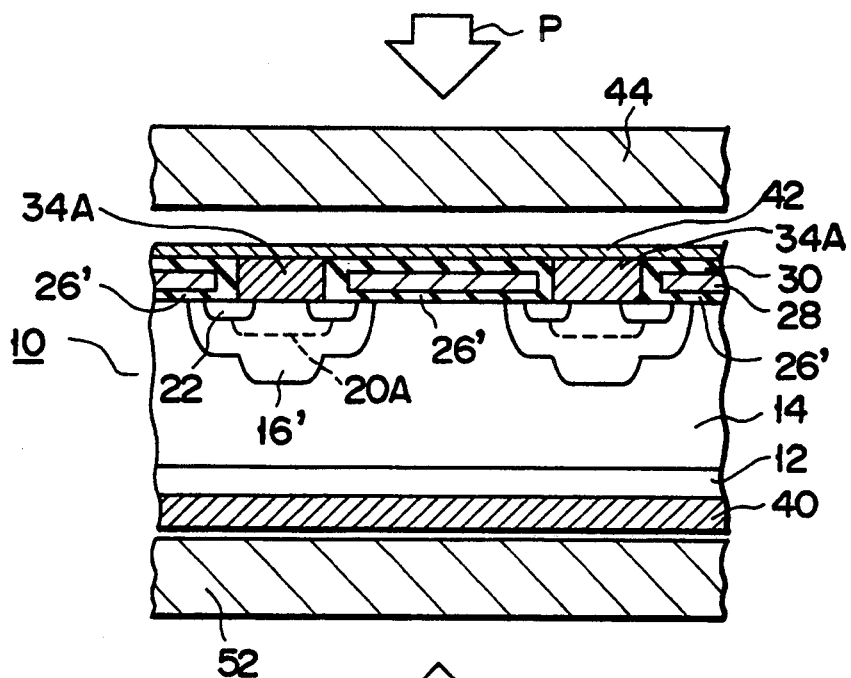
FIG. 16 is a schematic sectional view showing a portion around a pellet of an IGBT device according to the fourth embodiment of the present invention.

FIG. 16 is a schematic sectional view showing a portion around a pellet of an IGBT device according to the fourth embodiment of the present invention. Reference numerals in FIG. 16 denote the same parts as in FIG. 1, and only different parts will be described below.

As shown in FIG. 16, in the fourth embodiment, the level of the first aluminum layers 34A from the major surface of a substrate is substantially equal to the level of the insulating interlayer 30. Even when a source electrode is flattened by the above method, a pressure directly acting on the gate insulating film 26' can be scattered, thereby obtaining the same effect as in the third embodiment.

Figure 17:
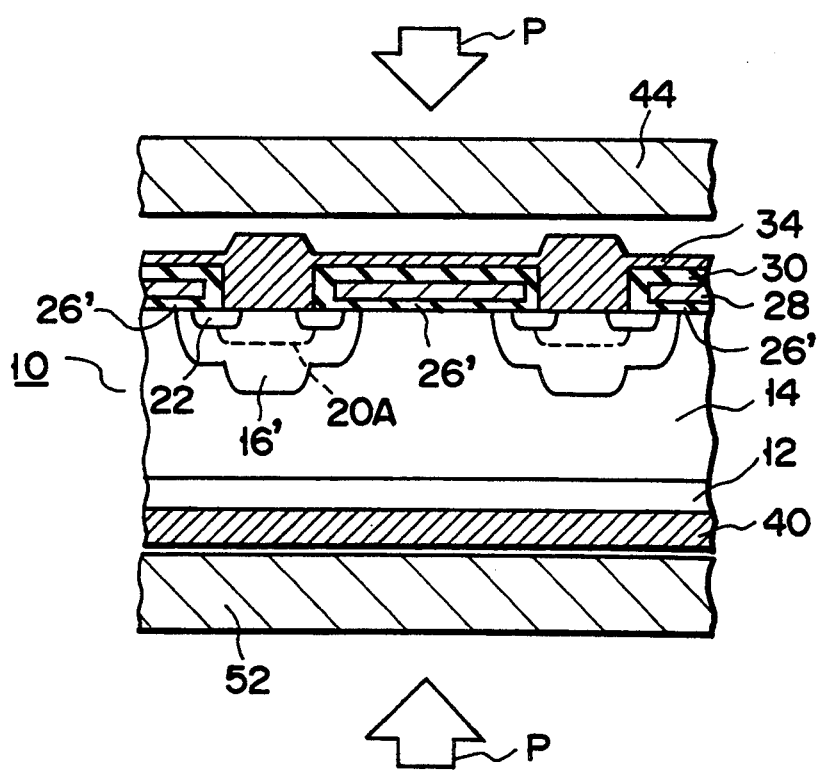
FIG. 17 is a schematic sectional view showing a portion around a pellet of an IGBT device according to the fifth embodiment of the present invention.

FIG. 17 is a schematic sectional view showing a portion around a pellet of an IGBT device according to the fifth embodiment of the present invention. The same reference numerals in FIG. 17 denote the same parts as in FIG. 1, and only different parts will be described below.

As shown in FIG. 17, in the fifth embodiment, the level of a portion which corresponds to the gate electrode 28 and which constitutes the source electrode 34 consisting of a first aluminum layer is selectively decreased. In this manner, a pressure acting on the gate insulating film 26' can be decreased, thereby obtaining the same effect as in the third embodiment.

A method of manufacturing the pellet used in the third to fifth embodiments will be described below.

FIGS. 18A to 18D are sectional views showing a first method of manufacturing the pellets according to the third and fourth embodiments in the order of steps. The same reference numerals in FIGS. 18A to 18D denote the same parts as in FIG. 1.

Figure 18A:
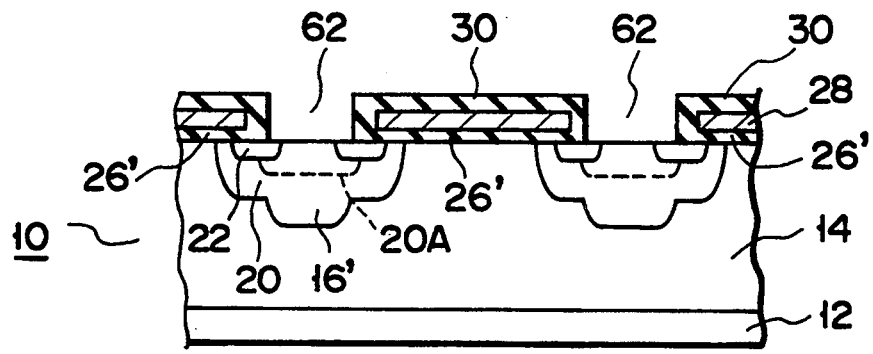
FIGS. 18A to 18D are sectional views showing a first method of manufacturing the pellets according to the third and fourth embodiments in the order of steps.

As shown in FIG. 18A, the body region 16', the base region 20, and the source region 22 are formed in the substrate 10, and the gate insulating film 26', the gate electrode 28, and the insulating interlayer 30 are formed on the major surface of the substrate 10. Thereafter, an opening 62 communicating with the source region 22 is formed in the insulating interlayer 30.

Figure 18B:
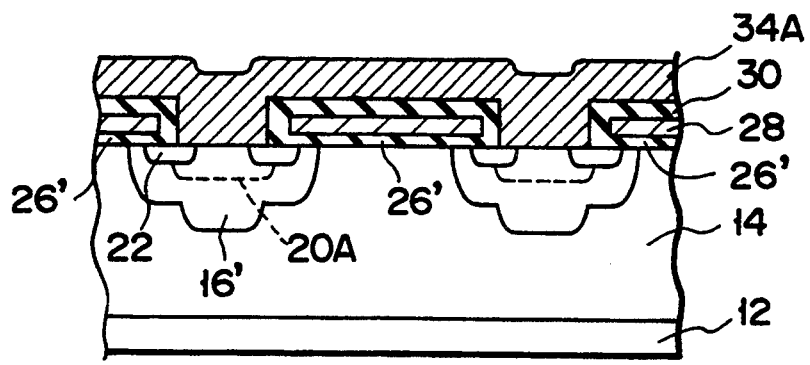

As shown in FIG. 18B, the first aluminum layer 34A is formed on the entire surface of the device by, e.g., sputtering.

Figure 18C:
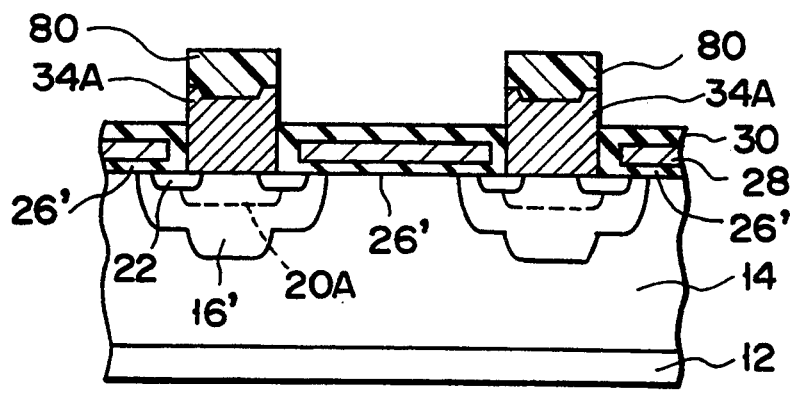

As shown in FIG. 18C, a photoresist is coated on the surface of the resultant structure, and a resist pattern 80 corresponding to, the opening 62 is formed by photoetching. A part of the first aluminum layer 34A is selectively removed using the pattern 80 as a mask.

Figure 18D:
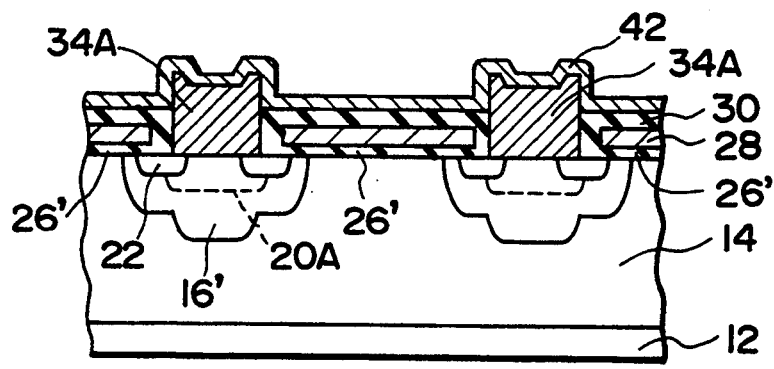

As shown in FIG. 18D, a second aluminum layer is formed on the entire surface of the device by, e.g., sputtering and patterned by photoetching to have a pattern of the conductive layer 42 corresponding to a gate wire (not shown) and a source electrode (not shown).

According to the above method, the pellet shown in FIG. 15 can be manufactured.

In the opening 62, when the thickness of the first aluminum layer 34A is set so that it is substantially even with the insulating interlayer 30, the pellet shown in FIG. 16 can be manufactured.

FIGS. 19A to 19D are sectional views showing a second method of manufacturing the pellets according to the third and fourth embodiments in the order of steps. The reference numerals in FIGS. 19A to 19D denote the same parts as in FIG. 1.

Figure 19A:
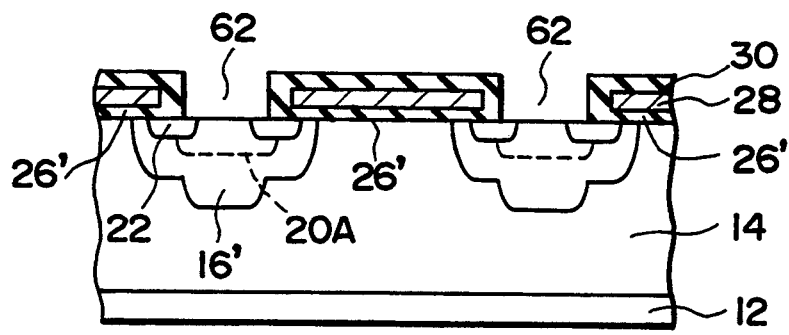
FIGS. 19A to 19D are sectional views showing a second method of manufacturing the pellets according to the third and fourth embodiments in the order of steps.

As shown in FIG. 19A, the opening 62 communicating with the source region 22 or the like is formed in the insulating interlayer 30 in the same manner as in the step in FIG. 18A.

Figure 19B:
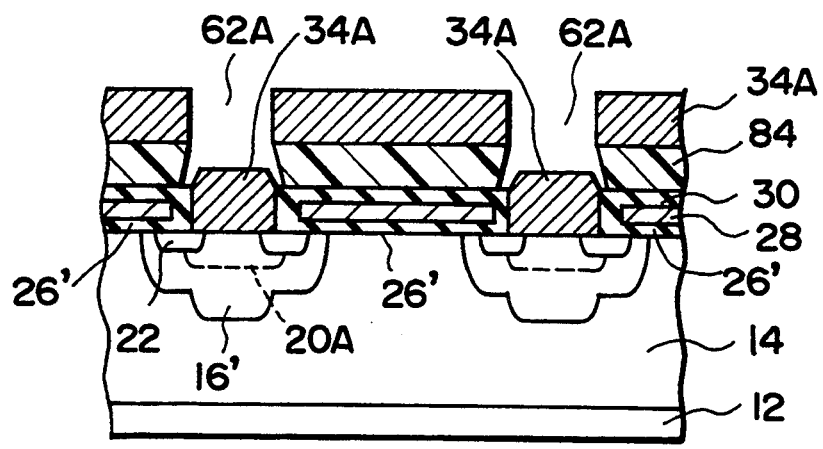

As shown in FIG. 19B, a photoresist film is coated on the resultant structure, and a resist pattern 84 having, an inversely tapered shape and corresponding to the gate electrode 28 is formed by photoetching. The first aluminum layer 34A is formed on the entire surface of the device by sputtering. At this time, the aluminum layer 34A is divided by an opening 62A of the pattern 84.

Figure 19C:
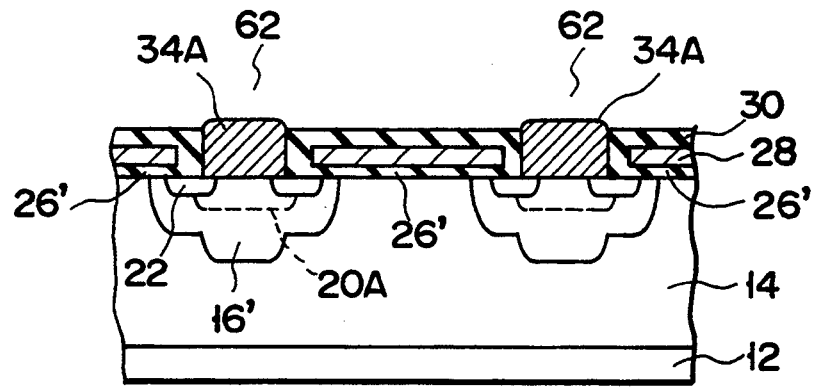

As shown in FIG. 19C, the resist pattern 84 is peeled off together with the aluminum layer 34A thereon to partially leave the aluminum layer 34A in a portion of the opening 62 by a lift-off technique.

Figure 19D:
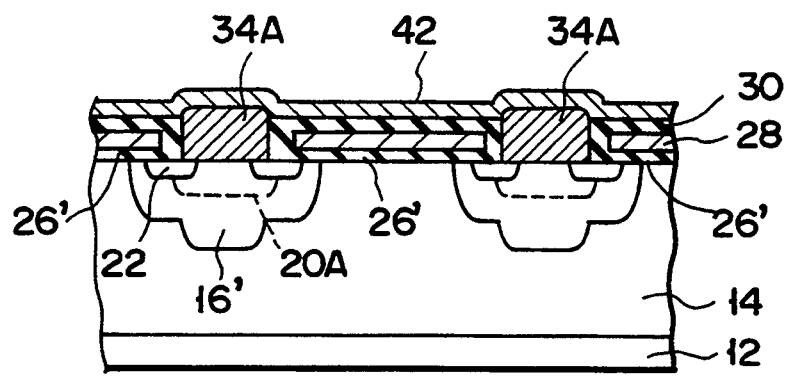

As shown in FIG. 19D, a second aluminum layer is formed on the entire surface of the device by, e.g., sputtering and patterned by photoetching to have the pattern of the conductive layer 42 corresponding to a gate wire (not shown) and a source electrode (not shown).

According to the above method, a pellet shown in FIG. 15 can be manufactured. In the opening 62, when the thickness of the first aluminum layer 34A is set so that it is substantially even with the insulating interlayer 30, the pellet shown in FIG. 16 can be manufactured.

FIGS. 20A to 20D are sectional views showing a third method of manufacturing the pellets according to the third and fourth embodiments in the order of steps. The same reference numerals in FIGS. 20A to 20D denote the same parts as in FIG. 1.

Figure 20A:
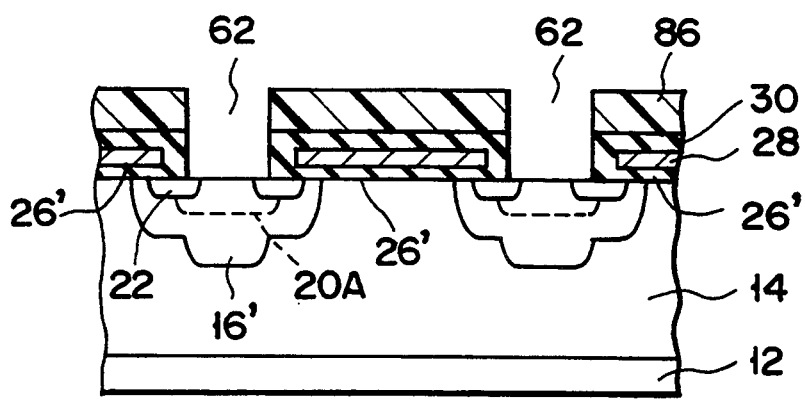
FIGS. 20A to 20D are sectional views showing a third method of manufacturing the pellets according to the third and fourth embodiments in the order of steps.

As shown in FIG. 20A, the opening 62 communicating with the source region 22 is formed in the insulating interlayer 30 in the same manner as the step in FIG. 18A. At this time, a photoresist pattern 86 used in formation of the opening 62 is left.

Figure 20B:
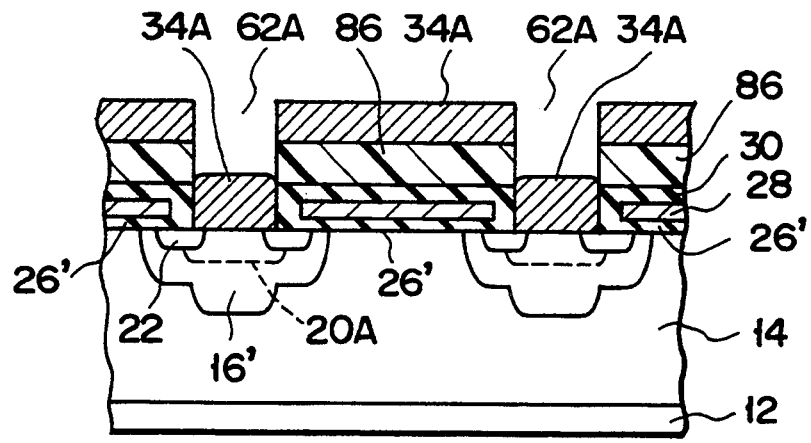

As shown in FIG. 20B, the first aluminum layer 34A is formed on the entire surface of the device by, e.g., sputtering. At this time, the aluminum layer 34A is divided by an opening 62A of the pattern 86.

Figure 20C:
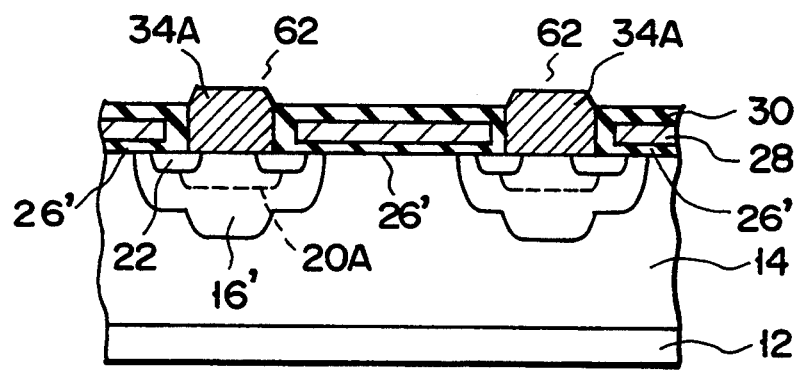

As shown in FIG. 20C, the resist pattern 86 is peeled off together with the aluminum layer 34A thereon, and the aluminum layer 34A is partially left in only the portion of the opening 62 by a lift-off technique.

Figure 20D:
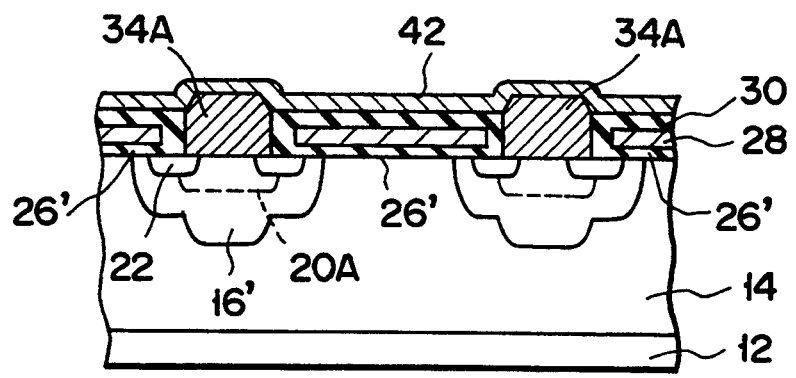

As shown in FIG. 20D, a second aluminum layer is formed on the entire surface of the device by, e.g., sputtering and patterned by photoetching to have the pattern of the conductive layer 42 corresponding to a gate wire (not shown) and a source electrode (not shown).

According to the above method, the pellet shown in FIG. 15 or FIG. 16 can be manufactured.

In the third method, when the resist pattern 86 shown in FIGS. 20A and 20B has an inversely tapered shape from the beginning, it can be easily lifted off in the step in FIG. 20C. In this case, the opening 62 is formed using the inversely tapered pattern 86 as a mask.

Figure 21A:
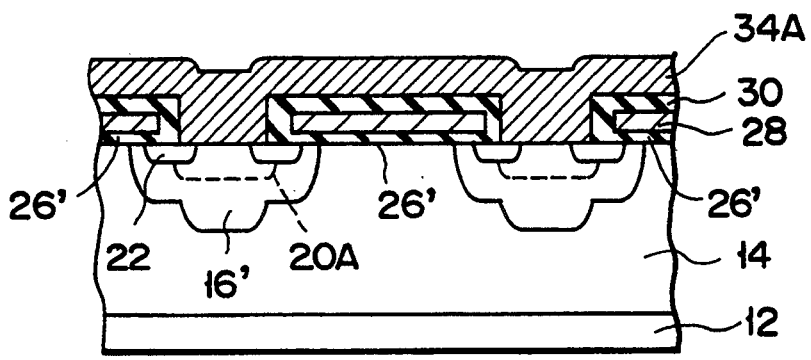
FIGS. 21A to 21C are sectional views showing a method of manufacturing the pellet according to the fifth embodiment in the order of steps.
Figure 21B:
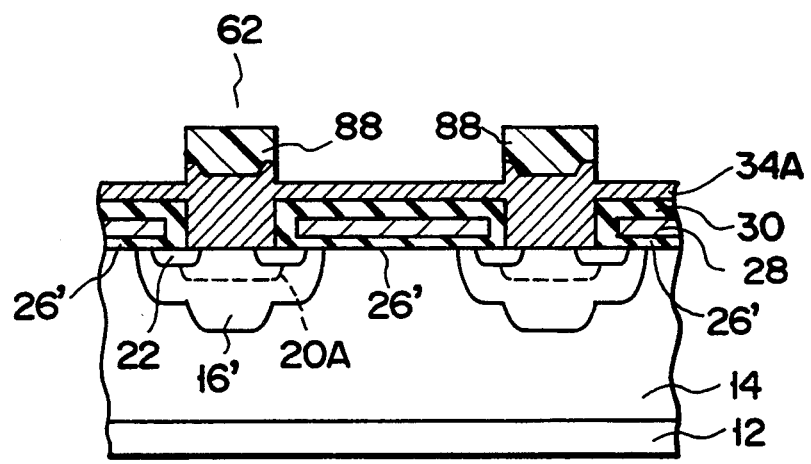
Figure 21C:
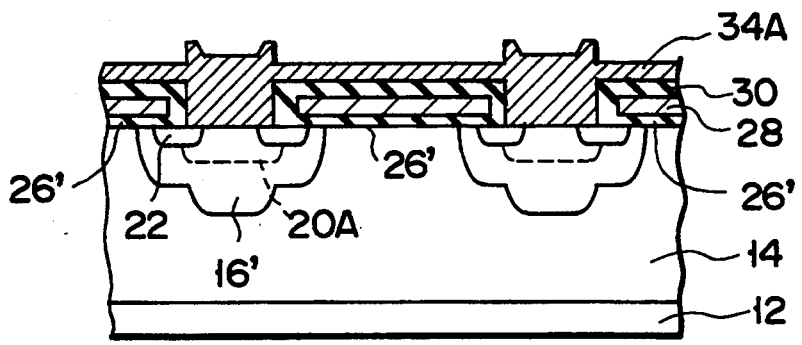

FIGS. 21A to 21C are sectional views showing a method of manufacturing the pellet according to the fifth embodiment in the order of steps. The same reference numerals in FIGS. 21A to 21C denote the same parts as in FIG. 1.

As shown in FIG. 21, the first aluminum layer 34A is formed on the entire surface of the device by, e.g., sputtering in the same manner as the step shown in FIG. 18B.

As shown in FIG. 21B, a photoresist is coated on the resultant structure, and a resist pattern 88 corresponding to, e.g., the opening 62 is formed by photoetching. A part of the first aluminum layer 34A is selectively etched using the pattern 88 as a mask to decrease the thickness of the first aluminum layer.

As shown in FIG. 21C, the pattern 88 is removed.

According to the above method, the pellet shown in FIG. 17 can be manufactured.

The present invention is not limited to the first to fifth embodiments, and various modifications can be made. For example, in the first to fifth embodiments, although an IGBT is used as an element formed on the pellet, a MOS thyrister, a MOSGTO, a power MOSFET, or the like can be used.

Figure 22:
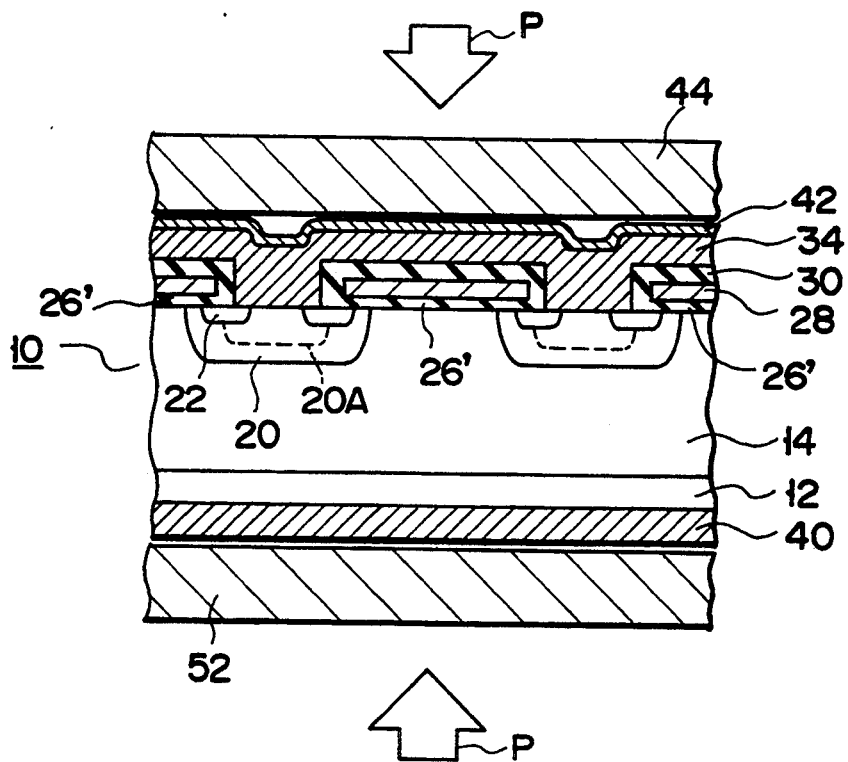
FIG. 22 is a sectional view showing a case wherein an element to be formed on a pellet is a MOS thyrister.

FIG. 22 is a sectional view showing a case wherein an element formed on a pellet is a MOS thyrister. The same reference numerals in FIG. 22 denote the same parts as in FIG. 1.

As shown in FIG. 22, the p-type body region 16 is removed from the pellet 10 shown in FIG. 10, and the entire p-type semiconductor region serves as a base region 20, thereby obtaining a MOS thyrister.

Figure 23:
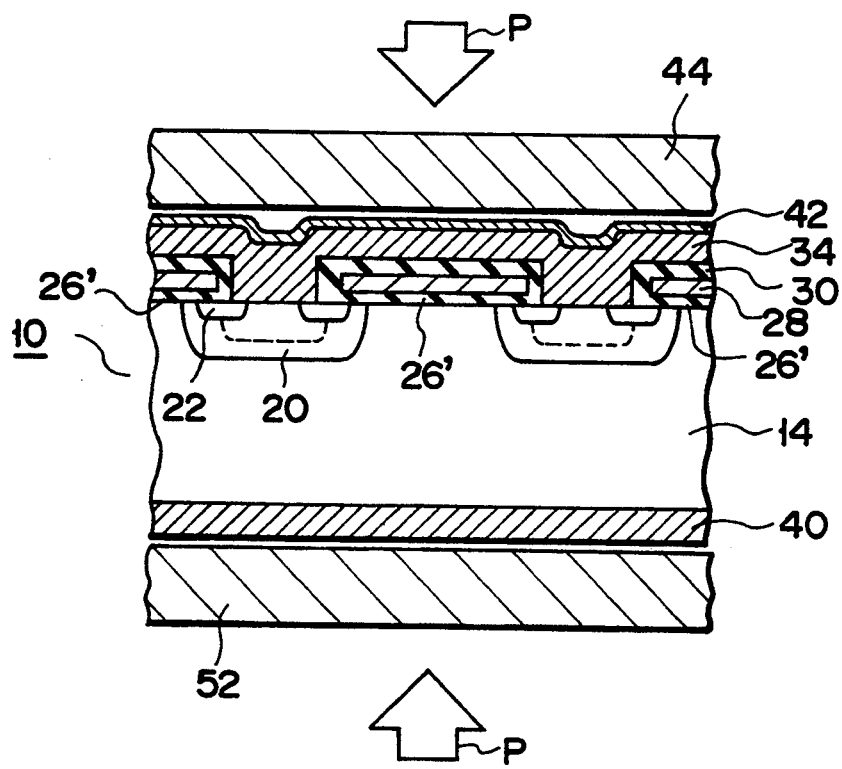
FIG. 23 is a sectional view showing a case wherein an element to be formed on a pellet is a power MOSFET.

FIG. 23 is a sectional view showing a case wherein an element formed on a pellet is a power MOSFET. The same reference numerals in FIG. 23 denote the same parts as in FIG. 1.

As shown in FIG. 23, the p-type body region 16 is removed from the pellet 10 shown in FIG. 1, and the p-type anode region is removed, thereby obtaining a power MOSFET.

Although an element has a flat substrate major surface, electrodes formed on the upper major surface of a substrate have different levels, thereby obtaining a pellet suitable for a compression type semiconductor device. Concerning this point, the element can be used as an element such as a bipolar transistor, of a thyrister, of a GTO, and the like which is controlled by injection of a base current. In this case, since a pellet suitable for a compression type semiconductor device can be obtained without damage to the substrate major surface, an element which has excellent characteristics and which does not have degradation in a breakdown voltage, variation in element characteristics, and a local concentration of a circulating current can be formed in the pellet.

The present invention can be variously changed without departing from the spirit and scope of the invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device for use in a pressure-contacted structure, the semiconductor device comprising:
    a semiconductor substrate having a major planar surface and a back-side planar surface and including an insulated gate bipolar transistor;
    a first semiconductor region of a first conductivity type provided in a region of the back-side planar surface of the semiconductor substrate, the first semiconductor region being an anode of the insulated gate bipolar transistor;
    a second semiconductor region of a second conductivity type provided in a region of the major planar surface of the semiconductor substrate and contacting the first semiconductor region, the second semiconductor region being a collector of the insulated gate bipolar transistor;
    a third semiconductor region of the first conductivity type provided in the second semiconductor region, the third semiconductor region being a first base of the insulated gate bipolar transistor;
    a fourth semiconductor region of the first conductivity type provided in the second semiconductor region, the fourth semiconductor region being a second base of the insulated gate bipolar transistor;
    a fifth semiconductor region of the second conductivity type provided in the third semiconductor region, the fifth semiconductor region being a first source of the insulated gate bipolar transistor;
    a sixth semiconductor region of the second conductivity type provided in the fourth semiconductor region, the sixth semiconductor region being a second source of the insulated gate bipolar transistor;
    a first insulating layer provided on a portion of the major planar surface of the semiconductor substrate in an area between the fifth semiconductor region and the sixth semiconductor region;
    a gate electrode provided on the first insulating layer;
    a second insulating layer provided over the major planar surface of the semiconductor substrate and covering the gate electrode, the second insulating layer having first and second windows, the first window overlapping the third and fifth semiconductor regions, the second window overlapping the fourth and sixth semiconductor regions; and
    a source electrode layer provided on the second insulating layer, the source electrode layer electrically connecting the third and fifth semiconductor regions via the first window and electrically connecting the fourth and sixth semiconductor regions via the second window, the source electrode layer projecting above the first and second windows, whereby at least a portion of the source electrode layer is indented in an area over the gate electrode.

2. The semiconductor device according to claim 1, wherein the first insulating layer is a gate insulating film.

3. The semiconductor device according to claim 2, wherein the source electrode layer comprises a conductive film.

4. The semiconductor device according to claim 3, wherein the conductive film comprises aluminum.

5. The semiconductor device according to claim 2, wherein the source electrode layer comprises a first conductive film, a second conductive film, and a third conductive film, the first conductive film being provided in the first window and having a top portion projecting from the first window, the second conductive film being provided in the second window and having a top portion projecting from the second window, and the third conductive film being provided on the second insulating film and electrically connected to the first and second conductive films.

6. The semiconductor device according to claim 5, wherein the first conductive film, the second conductive film and the third conductive film comprise aluminum.

* * * * *